(12) United States Patent
Heo et al.

(10) Patent No.: US 9,461,199 B2
(45) Date of Patent: Oct. 4, 2016

(54) NANOSTRUCTURE SEMICONDUCTOR LIGHT-EMITTING DEVICE

(71) Applicant: SAMSUNG ELECTRONICS CO., LTD., Suwon-si (KR)

(72) Inventors: Jae Hyeok Heo, Suwon-si (KR); Jung Sub Kim, Hwaseong-si (KR); Young Jin Choi, Seoul (KR); Jin Sub Lee, Suwon-si (KR); Sam Mook Kang, Osan-si (KR); Yeon Woo Seo, Hwaseong-si (KR); Han Kyu Seong, Seoul (KR); Dae Myung Chun, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/752,814

(22) Filed: Jun. 26, 2015

(65) Prior Publication Data
US 2016/0013362 A1  Jan. 14, 2016

(30) Foreign Application Priority Data

Jul. 11, 2014  (KR) .................. 10-2014-0087466

(51) Int. Cl.
*H01L 31/00* (2006.01)
*H01L 33/06* (2010.01)
*H01L 27/15* (2006.01)
*H01L 33/32* (2010.01)
(Continued)

(52) U.S. Cl.
CPC ............. *H01L 33/06* (2013.01); *H01L 27/153* (2013.01); *H01L 33/0025* (2013.01); *H01L 33/24* (2013.01); *H01L 33/32* (2013.01); *H01L 33/62* (2013.01); *H05B 33/0803* (2013.01)

(58) Field of Classification Search
CPC ....................................... H01L 33/06
USPC .............................. 257/13, 14, 21
See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

JP  2012-089900 A  5/2012
KR  10-2010-0133157 A  12/2010
(Continued)

*Primary Examiner* — Minh D A
(74) *Attorney, Agent, or Firm* — Muir Patent Law, PLLC

(57) ABSTRACT

There is provided a nanostructure semiconductor light-emitting device including a base layer formed of a first conductivity-type semiconductor, an insulating layer disposed on the base layer and having a plurality of openings, and a plurality of light-emitting nanostructures disposed the plurality of openings, respectively. Each of light-emitting nanostructures includes a nanocore formed of a first conductivity-type semiconductor, and an active layer and a second conductivity-type semiconductor layer sequentially disposed on a surface of the nanocore. The plurality of light-emitting nanostructures are formed through the same growth process and divided into n groups (where n is an integer of two or more), each of which having at least two light-emitting nanostructures. At least one of a diameter, a height, and a pitch of the nanocores is different by group so that the active layers emit light having different wavelengths by group.

20 Claims, 21 Drawing Sheets

(51) Int. Cl.
*H01L 33/62* (2010.01)
*H01L 33/24* (2010.01)
*H01L 33/00* (2010.01)
*H05B 33/08* (2006.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2012/0061641 A1 | 3/2012 | Seong et al. |
| 2014/0166974 A1* | 6/2014 | Yoo .................. H01L 33/24 257/13 |
| 2016/0099376 A1* | 4/2016 | Heo ................... H01L 33/005 438/34 |

FOREIGN PATENT DOCUMENTS

| | | |
|---|---|---|
| KR | 10-2012-0028104 A | 3/2012 |
| KR | 10-2012-0079310 A | 7/2012 |
| KR | 10-2012-0083084 A | 7/2012 |
| KR | 10-2013-0024052 A | 3/2013 |
| KR | 10-2013-0070660 A | 6/2013 |

\* cited by examiner

NANOSTRUCTURE SEMICONDUCTOR LIGHT-EMITTING DEVICE

CROSS-REFERENCE TO RELATED APPLICATION

This application claims priority under 35 U.S.C. §119 to Korean Patent Application No. 10-2014-0087466, filed on Jul. 11, 2014, with the Korean Intellectual Property Office, the entire disclosure of which is incorporated herein by reference.

BACKGROUND

Recently, semiconductor light-emitting devices using nanostructures have been developed as a new type of semiconductor light-emitting device technology. In semiconductor light-emitting devices using three-dimensional nanostructures (hereinafter, referred to as 'nanostructure semiconductor light-emitting devices'), crystallinity may be significantly improved and degradations in performance due to polarization may be prevented since active layers are obtained from a nonpolar surface or a semipolar surface. In addition, since light is emitted through a relatively large surface area, light extraction efficiency may be significantly improved.

SUMMARY

An aspect of the present disclosure relates to a nanostructure semiconductor light-emitting device having a plurality of light-emitting nanostructures, which emit light having different wavelengths.

Another aspect of the present disclosure relates to a nanostructure semiconductor light-emitting device capable of emitting white light through the combination of light having a plurality of different wavelengths.

According to an exemplary embodiment, a nanostructure semiconductor light-emitting device includes a base layer formed of a first conductivity-type semiconductor, an insulating layer disposed on the base layer and having a plurality of openings exposing portions of the base layer, and a plurality of light-emitting nanostructures disposed in the plurality of openings, respectively, each of the light-emitting nanostructures including a nanocore formed of a first conductivity-type semiconductor, an active layer, and a second conductivity-type semiconductor layer sequentially disposed on a surface of the nanocore. The plurality of light-emitting nanostructures are formed through the same growth process and divided into n groups (where n is an integer of two or more), each group having at least two light-emitting nanostructures. The active layer of each light-emitting nanostructure in each group has a quantum well structure, the quantum well thickness $T_i$ of the active layers of each group satisfy the following formulas (1) and (2):

$$T_i = K \frac{P_i^2}{(D_i \times H_i)} \quad 1 <= i <= n \tag{1}$$

$$T_1 < T_2 < \ldots < T_{n-1} < T_n \tag{2}$$

Here, K is a proportional constant, $D_i$ and $H_i$ are respectively a diameter and a height of the nanocores of the $i^{th}$ group, and $P_i$ is a pitch of the nanocores of the $i^{th}$ group. At least one of $D_i$, $H_i$, and $P_i$ is different so that the active layers emit light having different wavelengths by group.

The n groups may include first to third groups, and light emitted by the active layers of the first to third groups may be combined to provide white light.

In this case, an emission wavelength of the active layers of the first group may be in the range of about 430 nm to about 480 nm, an emission wavelength of the active layers of the second group may be in the range of about 480 nm to about 540 nm, and an emission wavelength of the active layers of the third group may be in the range of about 540 nm to about 605 nm.

A quantum well thickness of the active layers of the first group may be in the range of about 1 nm to about 5 nm, a quantum well thickness of the active layers of the second group may be in the range of about 1.5 nm to about 5.5 nm, and a quantum well thickness of the active layers of the third group may be in the range of about 2 nm to about 7.5 nm.

In this case, the nanocores of each group may have substantially the same size, and the quantum well thicknesses of the active layers of the second and third groups may be at least 40% greater than the quantum well thicknesses of the active layers of the first and second groups, respectively.

The quantum well thickness of the active layers of the first group may be about 1.5 nm or more.

Quantum wells of the active layers of the first to third groups may include nitride layers containing indium (In), and quantum wells of at least some of the active layers of the groups may have a different In content.

In an exemplary embodiment, a relative ratio ($P_1$:$P_2$:$P_3$) of pitches of nanocores of the first to third groups may satisfy the following formulas (a), and (b-1) to (b-3):

$$P_1 < P_2 < P_3 \tag{a}$$

$$1 < P_1 < 2.24 \tag{b-1}$$

$$1.2 < P_2 < 2.35 \tag{b-2}$$

$$1.4 < P_3 < 2.74 \tag{b-3}$$

In this case, sizes of the nanocores may be substantially the same, and the pitches of the nanocores of the second and third groups may be at least 20% greater than the pitches of the nanocores of the first and second groups, respectively.

The pitch of the nanocores of the first group may be in the range of about 0.5 μm to about 2.5 μm.

The nanocores of at least one of the first to third groups may have a different size from the nanocores of another group of the first to third groups.

In an exemplary embodiment, a relative ratio of the product of a diameter $D_i$ and a height $H_i$ of the nanocores may satisfy at least one of the following formulas (c) and (d), and satisfy formulas (e-1) to (e-3):

$$D_1 > D_2 > D_3 \tag{c}$$

$$H_1 > H_2 > H_3 \tag{d}$$

$$0.2 < D_1 \times H_1 < 1 \tag{e-1}$$

$$0.18 < D_2 \times H_2 < 0.67 \tag{e-2}$$

$$0.13 < D_3 \times H_3 < 0.5 \tag{e-3}$$

In an exemplary embodiment, the nanocores of each group may have substantially the same pitch, and the diameters of the nanocores of the second and third groups may be about at least 40% smaller than the diameters of the nanocores of the first and second groups, respectively.

In other exemplary embodiment, the nanocores of each group may have substantially the same pitch, and the heights of the nanocores of the second and third groups may be about at least 40% smaller than the heights of the nanocores of the first and second groups, respectively.

The nanocores of at least one group among the first to third groups may be arranged to have a different pitch from the nanocores of another group of the first to third groups.

The nanocores of each group may have the same height and different diameters.

The pitches of the nanocores of at least the third group may be greater than 1.5 μm.

An upper surface of the base layer may be divided into first to third regions, and the light-emitting nanostructures of the first to third groups may be arranged in the first to third regions, respectively.

In this case, at least one of the first to third regions may have a different size from another region of the first to third regions.

The n groups may include first and second groups, a wavelength of light emitted from the active layers of the first group maybe in the range of about 430 nm to about 470 nm, while a wavelength of light emitted from the active layers of the second group may be in the range of about 560 nm to about 590 nm.

According to an exemplary embodiment, a nanostructure semiconductor light-emitting device includes a base layer formed of a first conductivity-type semiconductor, an insulating layer disposed on the base layer and having a plurality of openings exposing portions of the base layer, a plurality of light-emitting nanostructures disposed in the plurality of openings, respectively, each of the light-emitting nanostructures including a nanocore formed of a first conductivity-type semiconductor, an active layer, and a second conductivity-type semiconductor layer sequentially disposed on a surface of the nanocore. The plurality of light-emitting nanostructures are formed in the same growth process, and divided into first to third groups, each group having at least two light-emitting nanostructures. The active layer of each light-emitting nanostructure in each group has a quantum well structure, the quantum wells of the active layers emit alight having different wavelengths by group, and satisfy the following formula (1):

$$T_1 < T_2 < T_3 \tag{1}$$

A relative ratio ($P_1:P_2:P_3$) of pitches of nanocores satisfy the following formulas:

$$P_1 < P_2 < P_3 \tag{a}$$

$$1 < P_1 < 2.24 \tag{b-1}$$

$$1.2 < P_2 < 2.35 \tag{b-2}$$

$$1.4 < P_3 < 2.74 \tag{b-3}$$

An emission wavelength of the active layers of the first group may be in the range of about 430 nm to about 480 nm, an emission wavelength of the active layers of the second group may be in the range of about 480 nm to about 540 nm, and an emission wavelength of the active layers of the third group may be in the range of about 540 nm to about 605 nm. The light emitted by the active layers of the first to third groups may be combined to provide white light.

The nanocores of each group have substantially the same height.

According to another aspect of the present disclosure, a package substrate includes first and second electrode structures, and the above-described nanostructure semiconductor light-emitting device mounted on the package substrate and electrically connected to the first and second electrode structures.

According to another aspect of the present disclosure, an illumination apparatus includes the above-described nanostructure semiconductor light-emitting device, a driver configured to drive the nanostructure light-emitting device, and an external connector configured to supply external power to the driver.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
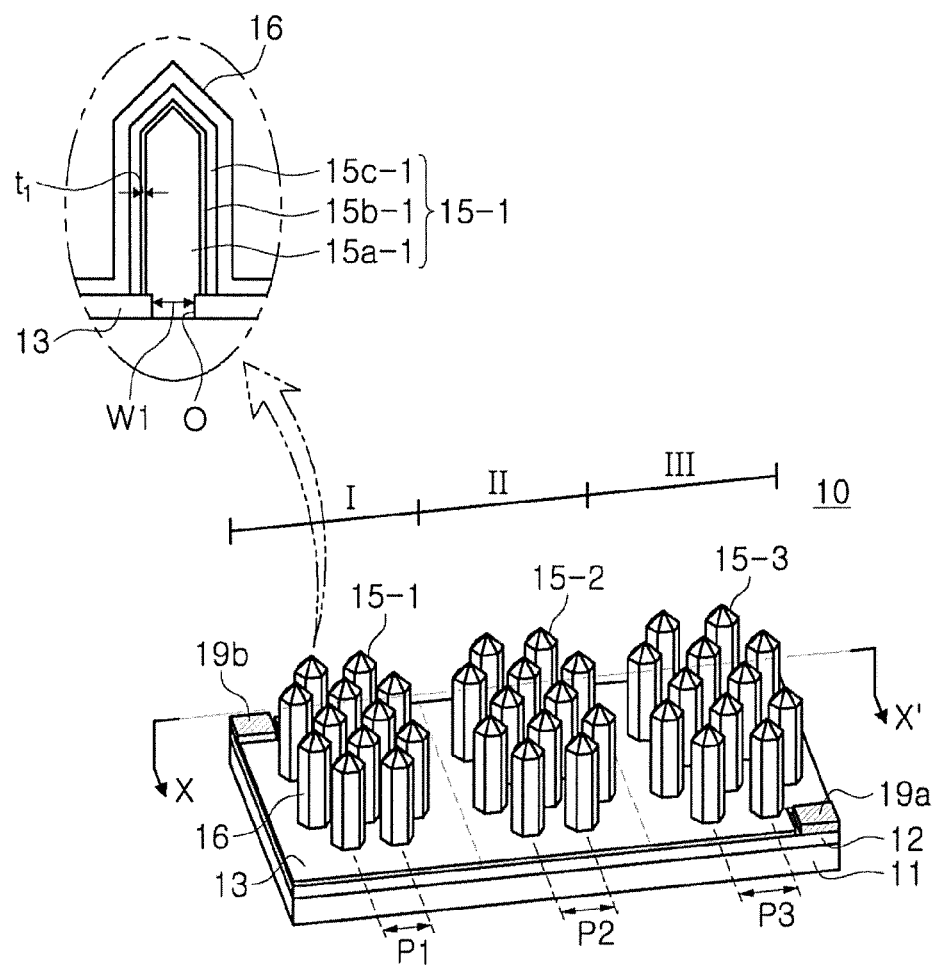
FIG. 1 is a perspective view schematically illustrating a nanostructure semiconductor light-emitting device according to an exemplary embodiment.

Hereinafter, embodiments of the present disclosure will be described in detail with reference to the accompanying drawings.

The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Reference throughout this disclosure to "one exemplary embodiment" or "an exemplary embodiment" is provided to emphasize a particular feature, structure, or characteristic, and do not necessarily refer to the same embodiment. Furthermore, the particular features, structures, or characteristics may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

Figure 2:
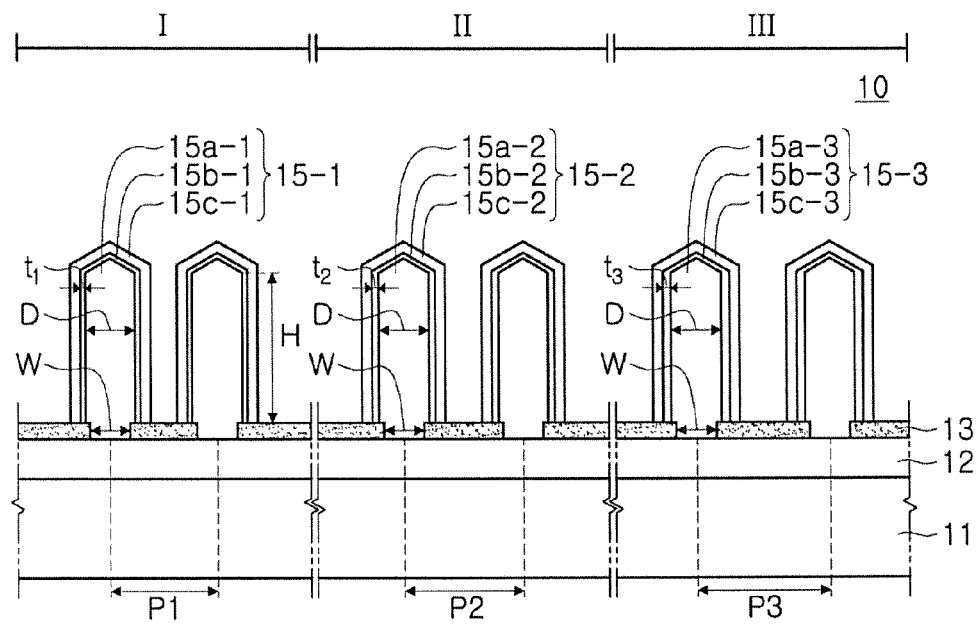
FIG. 2 is a cross-sectional view taken along line X-X' of the nanostructure semiconductor light-emitting device illustrated in FIG. 1.

FIG. 1 is a perspective view schematically illustrating a nanostructure semiconductor light-emitting device according to an exemplary embodiment of the present disclosure, and FIG. 2 is a cross-sectional view taken along line X-X' of the nanostructure semiconductor light-emitting device illustrated in FIG. 1 (wherein the contact electrode 16 is omitted).

The nanostructure semiconductor light-emitting device 10 illustrated in FIG. 1 may include a base layer 12 formed of a first conductivity-type semiconductor material, and a plurality of light-emitting nanostructures 15-1, 15-2, and 15-3 disposed on the base layer 12.

The nanostructure semiconductor light-emitting device 10 may include a substrate 11, on a surface of which the base layer 12 is disposed. The substrate 11 may be an insulating substrate, a conductive substrate, or a semiconductor substrate. For example, the substrate 11 may be sapphire, SiC, Si, $MgAl_2O_4$, MgO, $LiAlO_2$, $LiGaO_2$, or GaN.

The base layer 12 may provide a growth plane of the light-emitting nanostructures 15-1, 15-2, and 15-3. The base layer 12 maybe a nitride semiconductor satisfying an empirical formula $Al_xIn_yGa_{1-x-y}N$ ($0 \leq x<1$, $0 \leq y<1$, and $0 \leq x+y<1$), and may be doped with impurities of a specific conductivity-type. For example, the base layer 12 may be GaN doped with n-type impurities such as Si.

As illustrated in FIG. 2, an insulating layer 13 may include a plurality of openings O for growing nanocores 15a-1, 15a-2, and 15a-3. The insulating layer 13 may be an insulating material, such as $SiO_2$ or $SiN_x$, which can be used in a semiconductor process.

The light-emitting nanostructures 15-1, 15-2, and 15-3 may include nanocores 15a-1, 15a-2, and 15a-3 formed of a first conductivity-type semiconductor, and active layers 15b-1, 15b-2, and 15b-3 and second conductivity-type semiconductor layers 15c-1, 15c-2, and 15c-3, sequentially stacked on surfaces of the nanocores 15a-1, 15a-2, and 15a-3.

The nanocores 15a-1, 15a-2, and 15a-3 may be a nitride semiconductor satisfying an empirical formula $Al_xIn_yGa_{1-x-y}N$ ($0 \leq x<1$, $0 \leq y<1$, and $0 \leq x+y<1$), similar to the base layer 12. For example, the nanocores 15a-1, 15a-2, and 15a-3 may be n-type GaN.

The active layers 15b-1, 15b-2, and 15b-3 may have a multiple quantum well (MQW) structure in which a plurality of quantum wells and a plurality of quantum barriers are alternately stacked. For example, the active layers 15b-1, 15b-2, and 15b-3 may have a GaN/InGaN multiple quantum well structure, but are not limited thereto. The active layers 15b-1, 15b-2, and 15b-3 may have a single quantum well (SQW) structure.

The second conductivity-type semiconductor layers 15c-1, 15c-2, and 15c-3 may be a p-type nitride semiconductor satisfying an empirical formula $Al_xIn_yGa_{1-x-y}N$ ($0 \leq x<1$, $0 \leq y<1$, and $0 \leq x+y<1$). In some embodiments, the second conductivity-type semiconductor layers 15c-1, 15c-2, and 15c-3 may include a p-type AlGaN electron-blocking layer and a p-type GaN layer.

A contact electrode 16 according to the exemplary embodiment may be formed of an ohmic contact material capable of forming an ohmic contact with the second conductivity-type semiconductor layers 15c-1, 15c-2, and 15c-3. For example, the contact electrode 16 may include at least one of Ag, Ni, Al, Rh, Pd, Ir, Ru, Mg, Zn, Pt, and Au, and have a single layer structure or a multilayer structure. The contact electrode 16 may be formed of a transparent conductive material. The contact electrode 16 may be one of a transparent conductive oxide layer or a transparent conductive nitride layer so as to emit light toward the light-emitting nanostructures (that is, in a direction away from the substrate 11).

For example, the contact electrode 16 may be at least one selected from the group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), and $In_4Sn_3O_{12}$ or $Zn_{(1-x)}Mg_xO$ (zinc magnesium oxide, $0 \leq x \leq 1$). As necessary, the contact electrode 16 may include graphene.

The nanostructure semiconductor light-emitting device 10 may include first and second electrodes 19a and 19b (shown in FIG. 1). The first electrode 19a may be disposed on an exposed portion of base layer 12 formed of the first conductivity-type semiconductor. In addition, the second electrode 19b may be disposed on an exposed portion extending from the contact electrode 16.

The light-emitting nanostructures 15-1, 15-2, and 15-3 according to the exemplary embodiment may be divided into three groups (first to third groups) according to pitches $P_1$, $P_2$, and $P_3$ of the nanocores 15a-1, 15a-2, and 15a-3.

The light-emitting nanostructures 15-1, 15-2, and 15-3 of the first to third groups may be respectively disposed on three regions I, II, and III obtained by dividing an upper surface of the base layer 12. In this exemplary embodiment, the divided three regions I, II, and III may be arranged side-by-side and have similar sizes, but are not limited thereto. The divided three regions I, II, and III may have different sizes or different shapes. The amount of light obtained from the light-emitting nanostructures 15-1, 15-2, and 15-3 may be controlled by controlling the sizes of the divided three regions I, II, and III, respectively. For example, the area of a region corresponding to a long-wavelength band (e.g. red light) in which a light extraction efficiency is low may be greater than the area of a region corresponding to a short-wavelength band (e.g. green light). Such control of sizes may be usefully applied to implement white light having preferred color characteristics (e.g. a color temperature).

In this exemplary embodiment, a quantum well thickness $T_i$ of the active layers 15b-1, 15b-2, and 15b-3 may be controlled so that the active layers 15b-1, 15b-2, and 15b-3 emit light having different wavelengths by group. That is, the quantum well thickness $T_i$ of the active layers 15b-1, 15b-2, and 15b-3 may be designed to satisfy the following formulas (1) and (2) so that the active layers 15b-1, 15b-2, and 15b-3 emit light having different wavelengths by group.

$$T_i = K \frac{P_i^2}{(D_i \times H_i)} \quad 1 <= i <= n \qquad (1)$$

$$T_1 < T_2 < \ldots < T_{n-1} < T_n \qquad (2)$$

Here, K is a proportional constant, $D_i$ and $H_i$ represent a diameter and a height of nanocores belonging to the $i^{th}$ group, respectively, and $P_i$ represents a pitch of the nanocores belonging to the $i^{th}$ group. Here, n is an integer of at least two and represents the number of groups. In this exemplary embodiment, n is three, for example, and the number of groups may be three.

In addition, in formula (1), the proportional constant K may be a proportional constant defined depending on process conditions applied during the quantum well growth process. For example, the proportional constant K may be determined according to factors, such as temperature, pressure, and flow rate of sources, applied during the quantum well growth process.

As shown in the above formulas (1) and (2), by setting at least one of the diameter $D_i$, height $H_i$, and pitch $P_i$ of the nanocores to be different by group, the quantum wells may be grown to have different thicknesses even in the same growth process. Throughout this disclosure, the height H of the nanocores refers to the height of side surfaces of the nanocores providing substantially the same crystal plane rather than to the full height of the nanocores, unless described otherwise.

Thicknesses $t_1$, $t_2$, and $t_3$ of the active layers 15b-1, 15b-2, and 15b-3 illustrated in FIG. 2 may be proportional to actual thicknesses of the quantum wells. In this exemplary embodiment, the thickness of the active layers, that is, the thickness of the quantum wells, may be controlled by varying the pitch $P_i$ between the nanocores, which relates to intervals in an array of the nanocores.

Even the quantum wells having the same composition (the same bandgap) may emit light having different wavelengths in the case that the quantum wells have different thicknesses. For example, the smaller the thickness the quantum wells, the shorter the wavelength of light the quantum well may emit.

Figure 4:
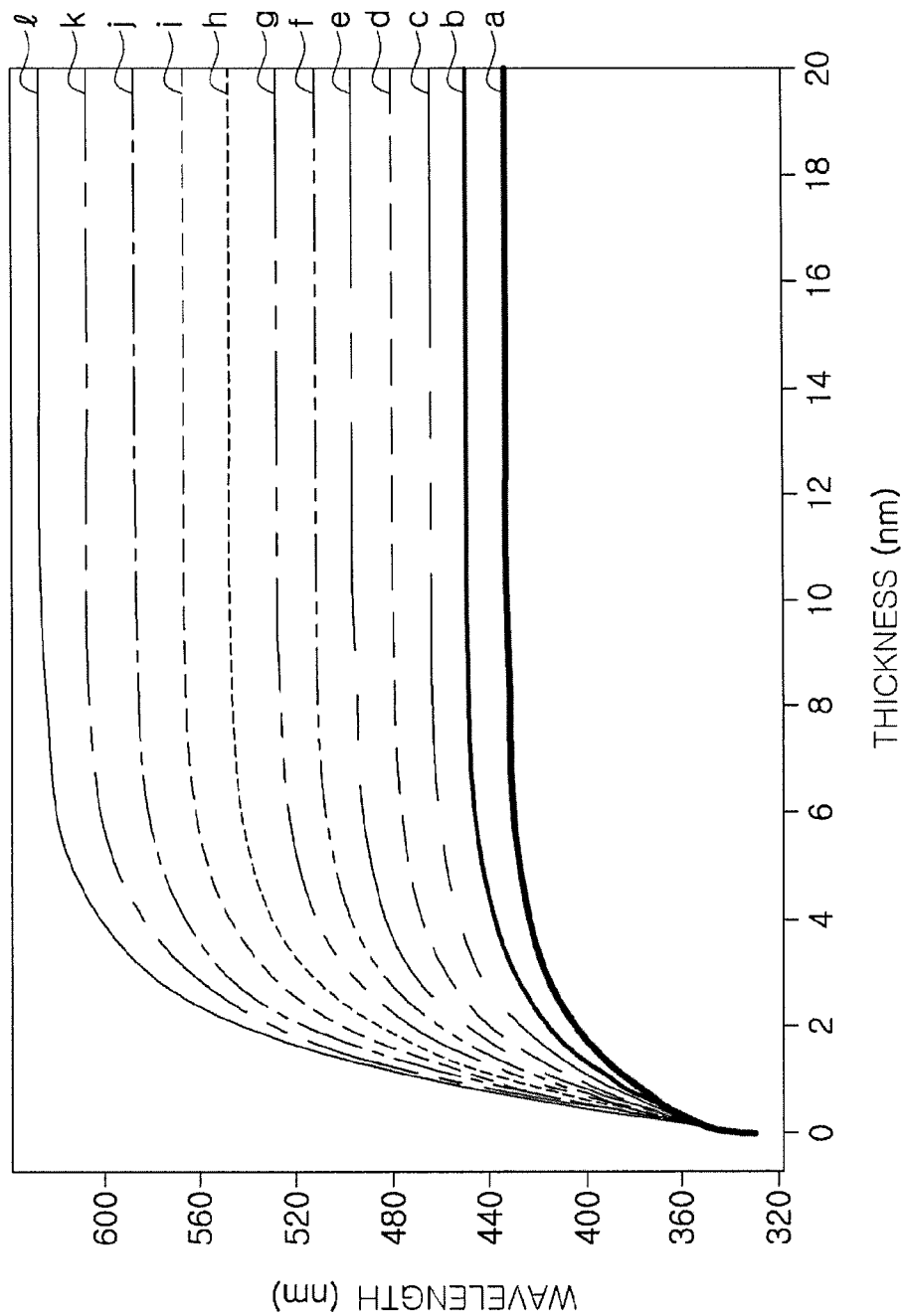
FIG. 4 is a graph illustrating the change in emission wavelengths according to the quantum well thickness.

FIG. 4 is a graph illustrating the change of the emission wavelength according to the change of the thickness of an $In_xGa_{1-x}N$ quantum well.

In FIG. 4, a to l illustrate the change in emission wavelengths according to the change in thickness of a quantum well having a different indium content. More specifically, a to l represent results obtained from the quantum wells in which a mole ratio of the indium composition increases by 2% from 13% (a) to 35% (l).

As illustrated in FIG. 4, as the indium composition x increases, the wavelength of light may become longer. In addition, the emission wavelength may be changed through only a change in the thickness of quantum wells, even in the case that the quantum wells have the same indium content.

By appropriately selecting the emission wavelengths of light obtained from the first group to the third group, final light may become white light. For example, an emission wavelength of the active layers of the first group may be in the range of about 430 nm to about 480 nm, and an emission wavelength of the active layers of the second group may be in the range of about 480 nm to about 540 nm. In addition, an emission wavelength of the active layers of the third group may be in the range of about 540 nm to about 605 nm.

With reference to the graph of FIG. 4, compositions and thicknesses of the quantum wells for obtaining conditions (the upper/lower limits of each range) of the emission wavelength by group may be listed in the following Table 1.

TABLE 1

| Wavelength (nm) | In Composition (mol %) | QW Thickness (nm) | Wavelength (nm) | In Composition (mol %) | QW thickness (nm) |
|---|---|---|---|---|---|
| 430 | 14 | 3.85 | 480 | 25 | 2.25 |
| 430 | 15 | 3.05 | 480 | 26 | 2.05 |
| 430 | 16 | 2.55 | 480 | 27 | 1.85 |
| 430 | 17 | 2.2 | 480 | 28 | 1.7 |
| 430 | 18 | 1.9 | 480 | 29 | 1.6 |
| 430 | 19 | 1.75 | 480 | 30 | 1.5 |
| 430 | 20 | 1.55 | 540 | 27 | 5.5 |
| 430 | 21 | 1.45 | 540 | 28 | 4.1 |
| 430 | 22 | 1.35 | 540 | 29 | 3.45 |
| 430 | 23 | 1.25 | 540 | 30 | 3 |
| 430 | 24 | 1.15 | 540 | 31 | 2.7 |
| 430 | 25 | 1.1 | 540 | 32 | 2.45 |
| 430 | 26 | 1.05 | 540 | 33 | 2.3 |
| 430 | 27 | 1 | 540 | 34 | 2 |
| 480 | 20 | 4.75 | 540 | 35 | 2 |
| 480 | 21 | 3.75 | 605 | 33 | 7.5 |
| 480 | 22 | 3.15 | 605 | 34 | 5.1 |
| 480 | 23 | 2.8 | 605 | 35 | 4.2 |
| 480 | 24 | 2.5 | — | — | — |

Based on the Table 1, a range of a quantum well thickness for obtaining the emission wavelength by group may be derived. For example, in consideration of thicknesses corresponding to 430 nm and 480 nm, the upper limit and the lower limit of the range of the emission wavelength of the active layers of the first group, respectively, the quantum well thickness of the first group may be in the range of about 1 nm to about 5 nm. Similarly, the quantum well thickness of the active layers of the second group may be in the range of about 1.5 nm to about 5.5 nm, and the quantum well thickness of the active layers of the third group may be in the range of about 2 nm to about 7.5 nm.

The range of indium content according to the quantum well thickness may also be set based on FIG. 4 and Table 1. For example, the indium content of a quantum well of the first group may be 14% to 30%, and the indium content of a quantum well of the second group may be 20% to 35%. In addition, the indium content of a quantum well of the third group may be 27% to 35%.

Meanwhile, as illustrated in FIG. 4, in the case of InGaN, it was found that there is a saturation region in which the wavelength does not increase according to the increase in the quantum well thickness.

For example, in the case that an $In_xGa_{1-x}N$ quantum well has a thickness of about 10 nm or more, the emission wavelength does not increase. In addition, the minimum thickness of the quantum well for obtaining a quantum confinement effect may be about 1 nm. In this regard, the quantum well thickness may be appropriately selected from within the range of about 1 nm to 10 nm in consideration of the range of the wavelengths.

The quantum well thickness may affect internal quantum efficiency (IQE). For example, the active layers of the first group were designed to have quantum wells having different indium compositions and thicknesses in order to obtain an emission wavelength of about 450 nm, and changes of IQE according to the thickness were checked. Table 2 shows the result thereof.

TABLE 2

| QW Thickness (nm) | In Composition (%) | Wavelength (nm) | Internal Quantum Efficiency | V | I |
|---|---|---|---|---|---|
| 1 | 35 | 450 | 43.3 | 3.73 | 326 |
| 1.5 | 28 | 450 | 49.1 | 3.76 | 340 |
| 2 | 25 | 450 | 51.5 | 3.74 | 328 |
| 3 | 22 | 450 | 52.5 | 3.79 | 338 |
| 4 | 21 | 451 | 51.6 | 3.77 | 332 |
| 5 | 20 | 449 | 50.8 | 3.73 | 320 |
| 6 | 19.5 | 449 | 50.1 | 3.82 | 345 |
| 7 | 19.4 | 449 | 44.2 | 3.76 | 329 |

As listed in the Table 2, although it may slightly differ depending on the emission wavelength, in the case of the quantum well having the emission wavelength of about 450 nm, IQE was lowered when the quantum well thickness was 1 nm and 7 nm. Such degradation in IQE may be related to crystallinity, and the quantum well thickness may be selected in the range of 1.5 nm to 6 nm in consideration thereof.

In an actual process, the change of wavelength according to the quantum well thickness $T_i$ may be greater than the result illustrated in FIG. 4. This is because the compositions of quantum wells of the active layers 15b-1, 15b-2, and 15b-3 are different by group even though the active layers 15b-1, 15b-2, and 15b-3 are grown under the same process conditions. For example, when the quantum well is a nitride layer containing indium, such as InGaN, the indium content of the quantum well having a small thickness may be relatively low, even in the case that the same process conditions (for example, the same flow rate of indium source) are applied. Accordingly, in the actual process, the change in wavelength of the quantum wells may be greater than the change in wavelength of the quantum wells caused by the difference in quantum well thickness illustrated in FIG. 4. As a result, each of the active layers 15b-1, 15b-2, and 15b-3 may emit light satisfying the wavelength conditions for obtaining white light.

As described above, different emission wavelengths by group may combine to provide white light through the active layers 15b-1, 15b-2, and 15b-3. For example, the first to third groups of quantum wells may be designed to emit light in blue, green, and red bands.

The emission wavelength of the active layers 15b-1 of the first group may be in the range of about 430 nm to about 480 nm, the emission wavelength of the active layers 15b-2 of the second group may be in the range of about 480 nm to about 540 nm, and the emission wavelength of the active layers 15b-3 of the third group may be in the range of about 540 nm to about 605 nm.

The quantum well thickness of the active layers 15b-1 of the first group may be in the range of about 1 nm to about 5 nm, the quantum well thickness of the active layers 15b-2 of the second group may be in the range of about 1.5 nm to about 5.5 nm, and the quantum well thickness of the active layers 15b-3 of the third group may be in the range of about 2 nm to about 7.5 nm.

In this exemplary embodiment, the nanocores 15a-1, 15a-2, and 15a-3 may be arranged at different pitches ($P_1<P_2<P_3$) by group as illustrated in FIG. 2. The pitches $P_1$, $P_2$, and $P_3$ may be set in such a manner that the emission wavelengths of the active layers 15b-1, 15b-2, and 15b-3 are mixed to form white light. The conditions of pitches $P_1$, $P_2$, and $P_3$ of the nanocores may be represented by the following formulas (a), and (b-1) to (b-3).

$$P_1<P_2<P_3 \tag{a}$$

$$1<P_1<2.24 \tag{b-1}$$

$$1.2<P_2<2.35 \tag{b-2}$$

$$1.4<P_3<2.74 \tag{b-3}$$

In formulas (b-1) to (b-3), the numbers may not refer to numbers of a specific unit, but a constant defining a relative ratio ($P_1:P_2:P_3$) between the pitches of active layers in different groups.

As illustrated in FIG. 2, nanocores 15a-1 of the first group may be arranged at a first pitch $P_1$, and nanocores 15a-2 of the second group may be arranged at a second pitch $P_2$ greater than the first pitch $P_1$. In addition, the nanocores 15a-3 of the third group maybe arranged at a third pitch $P_3$ greater than the second pitch $P_2$. In this exemplary embodiment, the nanocores 15a-1, 15a-2, and 15a-3 of the first to third groups may have substantially the same diameter D and substantially the same height H. In this disclosure, the height H of a nanocore may not refer to a height to an end of the nanocore, but refer to heights of side surfaces of nanocores 15a-1, 15a-2, and 15a-3, as illustrated in FIG. 2, unless described otherwise.

However, the inventive concept may not limited to the case in that the sizes of nanocores are the same, and diameters and/or the heights thereof may differ by group. This will be described in more detail with reference to FIGS. 5 and 6.

Figure 3:
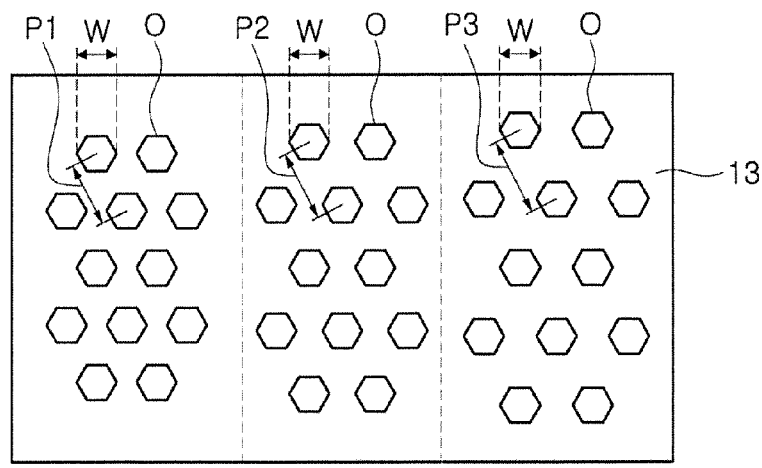
FIG. 3 is a plan view illustrating examples of opening patterns in a mask of FIG. 2.

Arrangements of the nanocores 15a-1, 15a-2, and 15a-3 according to an exemplary embodiment may be obtained by controlling patterns of the openings O in the insulating layer 13 disposed on the base layer 12. FIG. 3 is a plan view of the insulating layer 13 illustrated in FIG. 2.

Referring to FIG. 3, openings O having the same width W and different pitches ($P_1<P_2<P_3$) are formed in the insulating layer 13 throughout the first to third regions I, II, and III. For example, the openings O of the first region I are arranged at a first pitch $P_1$, and the openings O of the second region II are arranged at a second pitch $P_2$ greater than first pitch $P_1$. In addition, the openings O of the third region III are arranged at a third pitch $P_3$ greater than the second pitch $P_2$. Under the same process conditions, pitches of the nanocores 15a-1, 15a-2, and 15a-3 may be respectively determined according to the pitches $P_1$, $P_2$, and $P_3$ differently set by group.

The nanocores 15a-1, 15a-2, and 15a-3 may be grown under the same process conditions. That is, the nanocores 15a-1, 15a-2, and 15a-3 may be grown on the first to third regions I, II, and III using the same process in the same chamber. Although the pitches are different ($P_1<P_2<P_3$) by group, the nanocores 15a-1, 15a-2, and 15a-3 may be grown to have substantially the same diameter D by group. Accordingly, final nanocores 15a-1, 15a-2, and 15a-3 may have diameters the same as or a little greater than the widths W of the openings O of the insulating layer 13.

The greater pitch the nanocores 15a-1, 15a-2, and 15a-3 are arranged at, the greater thickness the active layers grown on surfaces of the nanocores 15a-1, 15a-2, and 15a-3 ($t_1<t_2<t_3$) may have. For example, the quantum well thickness of the active layers 15b-2 of the second group may be greater than the quantum well thickness of the active layers 15b-1 of the first group, and smaller than the quantum well thickness of the active layers 15b-3 of the third group.

As described in this exemplary embodiment, when designing emission wavelengths of the active layers 15b-1, 15b-2, and 15b-3 by group without using the difference in size (diameter and/or height) but instead using the difference in pitch, a sufficient difference in pitch needs to be secured by group in order to satisfy the wavelength conditions for implementing white light. That is, the pitches $P_2$ and $P_3$ of the nanocores of the second and third groups may be at least 20% greater than the pitches $P_1$ and $P_2$ of the nanocores of the first and second groups, respectively.

For example, the pitch $P_1$ of the nanocores of the first group may be appropriately designed to be in the range of about 0.5 μm to about 2.5 μm, and the pitches $P_2$ and $P_3$ of the nanocores of the second and third groups may be appropriately designed according to a relative ratio satisfying formulas (a), and (b-1) to (b-3). In addition, the pitches $P_2$ and $P_3$ of the nanocores of the second and third groups may be designed to be about at least 20% greater than the pitches $P_1$ and $P_2$ of the nanocores of the first and second group, respectively, in order to secure a sufficient difference in emission wavelength by group.

In this exemplary embodiment, nanocores of at least one of the first to third groups may have a different size from nanocores of another group. In this manner, by designing the emission wavelengths of the active layers 15b-1, 15b-2, and 15b-3 using not only the pitch $P_i$ but also the diameter $D_i$ and the height $H_i$, the emission wavelengths of the active layers 15b-1, 15b-2, and 15b-3 may be designed to satisfy the conditions for obtaining preferred white light even when the difference in pitch is small (please refer to FIG. 7).

In addition, unlike the exemplary embodiment illustrated in FIG. 2, light emitted by the active layers may have different wavelengths through the difference in sizes of the nanocores, and thereby the light having the different emission wavelengths maybe combined to form white light. Such an embodiment may be described with reference to FIGS. 5 and 6.

Figure 5:
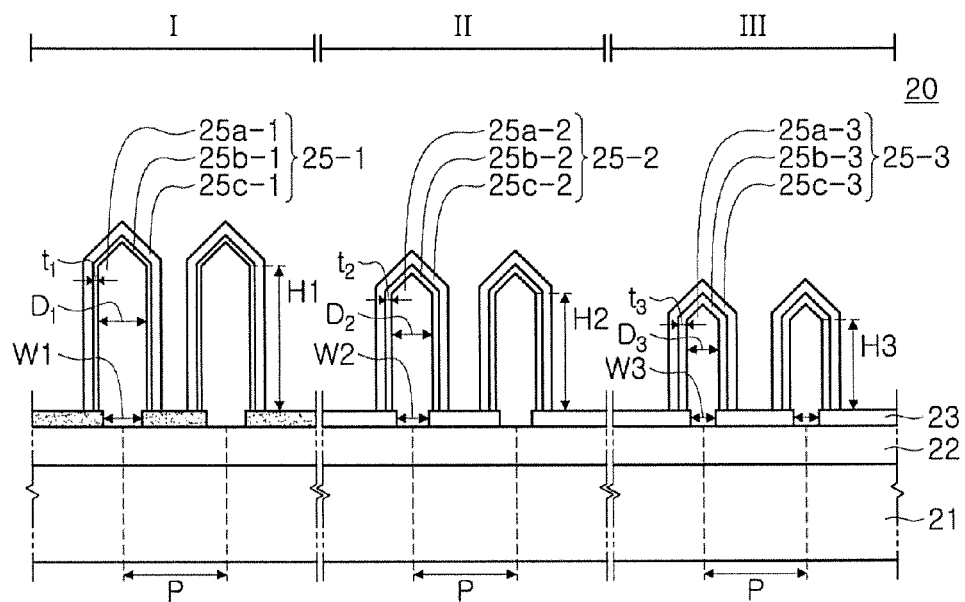
FIG. 5 is a cross-sectional view illustrating a nanostructure semiconductor light-emitting device according to an exemplary embodiment.
Figure 6:
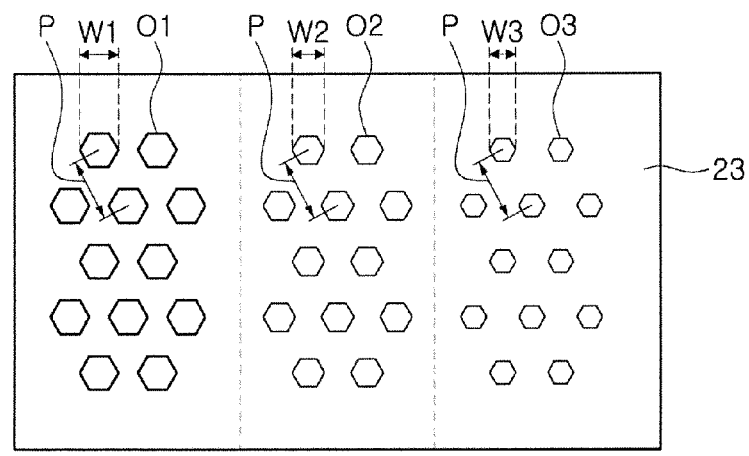
FIG. 6 is a plan view illustrating examples of opening patterns in the mask of FIG. 5.

FIG. 5 is a cross-sectional view illustrating a nanostructure semiconductor light-emitting device according to an exemplary embodiment of the present disclosure, and FIG. 6 is a plan view illustrating an example of opening patterns in a mask of FIG. 5.

A nanostructure semiconductor light-emitting device 20 illustrated in FIG. 5, similar to the exemplary embodiment illustrated in FIG. 2, may include a base layer 22 formed of a first conductivity-type semiconductor material, and a plurality of light-emitting nanostructures 25-1, 25-2, and 25-3 disposed on the base layer 22.

The nanostructure semiconductor light-emitting device 20 may include a substrate 21 having an upper surface on which the base layer 22 is disposed. The base layer 22 may provide a plane for growing the light-emitting nanostructures 25-1, 25-2, and 25-3. An insulating layer 23 may include a plurality of openings O1, O2, and O3 for growing nanocores 25a-1, 25a-2, and 25a-3.

The light-emitting nanostructures 25-1, 25-2, and 25-3 according to the exemplary embodiment of the present disclosure may be divided into three groups (first to third groups) according to the sizes of the nanocores 25a-1, 25a-2, and 25a-3. The first to third groups of light-emitting nanostructures 25-1, 25-2, and 25-3 may be respectively disposed on three regions I, II, and III obtained by dividing an upper surface of the base layer 22.

The light-emitting nanostructures 25-1, 25-2, and 25-3 may respectively include the nanocores 25a-1, 25a-2, and 25a-3 formed of the first conductivity-type semiconductor, and active layers 25b-1, 25b-2, and 25b-3 and second conductivity-type semiconductor layers 25c-1, 25c-2, 25c-3 sequentially stacked on surfaces of the nanocores 25a-1, 25a-2, and 25a-3. Hereinafter, components the same as or similar to those described in the above exemplary embodiments may be understood with reference to the related descriptions thereof in the above exemplary embodiments, unless described otherwise.

In the exemplary embodiment, the active layers 25b-1, 25b-2, and 25b-3 may have different quantum well thicknesses $T_i$ in order to emit light having different wavelengths. As illustrated in FIG. 5, diameters $D_i$ and heights $H_i$ of the nanocores 25a-1, 25a-2, and 25a-3 may be differently set by group so that quantum wells may be grown thereon to have different thicknesses by group even in the same growth process.

As described above, even when grown under the same process conditions, the active layers 25b-1, 25b-2, and 25b-3 grown on the nanocores 25a-1, 25a-2, and 25a-3 having different sizes may have different quantum well thicknesses. As a result, the active layers 25b-1, 25b-2, and 25b-3 may emit light having different wavelengths by group, and the nanostructure semiconductor light-emitting device 20 may ultimately provide white light by the combination of the light having the different wavelengths. The quantum well thicknesses may be appropriately selected in the range of about 1 nm to about 10 nm by considering the difference in wavelength.

In addition, even when grown under the same process conditions, the compositions of the quantum wells of the active layers 25b-1, 25b-2, and 25b-3 may differ by group. For example, when the quantum wells are nitride layers containing indium such as InGaN, the quantum well having a relatively small thickness may have a relatively small indium content even when the same process conditions (e.g. the same flow rate of indium source) are applied. As a result, the difference in wavelength of the quantum wells obtained in an actual process may be greater than that the difference in wavelength of the quantum wells obtained only by the difference in quantum well thickness (please refer to FIG. 4). For example, each of the active layers 25b-1, 25b-2, and 25b-3 may emit light satisfying wavelength conditions for obtaining white light.

As described above, the different emission wavelengths from the active layers 25b-1, 25b-2, and 25b-3 may be combined to obtain white light. For example, the first to third groups of active layers 25b-1, 25b-2, and 25b-3 may be designed to emit light having a blue wavelength band, a green wavelength band, and a red wavelength band, respectively.

The emission wavelength of the active layers 25b-1 of the first group may be in the range of about 430 nm to about 480 nm, the emission wavelength of the active layers 25b-2 of the second group may be in the range of about 480 nm to about 540 nm, and the emission wavelength of the active layers 25b-3 of the third group may be in the range of about 540 nm to about 605 nm.

In order to satisfy the wavelength conditions, the quantum well thickness of the active layers 25b-1 of the first group maybe in the range of about 1 nm to about 5 nm, the quantum well thickness of the active layers 25b-2 of the second group may be in the range of about 1.5 nm to about 5.5 nm, and the quantum well thickness of the active layers 25b-3 of the third group may be in the range of about 2 nm to about 7.5 nm.

As illustrated in FIG. 5, in this exemplary embodiment, the nanocores 25a-1, 25a-2, and 25a-3 may have different sizes, that is, different diameters ($D_1 > D_2 > D_3$) and different heights ($H_1 > H_2 > H_3$) by group. The diameters and heights of the nanocores 25a-1, 25a-2, and 25a-3 may be set by group in such a manner that the wavelengths emitted by the active layers 25b-1, 25b-2, and 25b-3 are combined to form white light. For this, the different diameters $D_1$, $D_2$, and $D_3$ and the different heights $H_1$, $H_2$, and $H_3$ of the nanocores may be set to satisfy at least one of (c) and (d), and satisfy (e-1) to (e-3).

$$D_1 > D_2 > D_3 \tag{c}$$

$$H_1 > H_2 > H_3 \tag{d}$$

$$0.2 < D_1 \times H_1 < 1 \tag{e-1}$$

$$0.18 < D_2 \times H_2 < 0.67 \tag{e-2}$$

$$0.13 < D_3 \times H_3 < 0.5 \tag{e-3}$$

In formulas (e-1) to (e-3), the numbers may be understood not as numbers of a specific unit, but constants defining sizes (e.g. a surface area) of the nanocores by group and a relative ratio therebetween.

As illustrated in FIG. 5, the nanocores 25a-1 of the first group may have a first diameter $D_1$ and a first height $H_1$, and the nanocores 25a-2 of the second group may have a second diameter $D_2$ smaller than the first diameter $D_1$ and a second height $H_2$ lower than the first height $H_1$. In addition, the nanocores 25a-3 of the third group may have a third diameter $D_3$ smaller than the second diameter $D_2$, and a third height $H_3$ smaller than the second height $H_2$. In this exemplary embodiment, the diameter and the height change together. However, the sizes (e.g. a surface area) of the nanocores 25a-1, 25a-2, and 25a-3 may change through a change of only one of diameter and height thereof. In addition, the first to third groups of nanocores 25a-1, 25a-2, and 25a-3 are illustrated as having substantially the same pitches P, but embodiments are not limited thereto. The first to third groups of nanocores 25a-1, 25a-2, and 25a-3 may be arranged at a different pitch. Such an exemplary embodiment will be described with reference to FIG. 7.

The sizes of the nanocores 25a-1, 25a-2, and 25a-3 according to the exemplary embodiment may be controlled by controlling patterns of the openings O1, O2, and O3 of the insulating layer 23 disposed on the base layer 22. FIG. 6 is a plan view of an insulating layer 23 employed in FIG. 5.

Referring to FIG. 6, the insulating layer 23 may include openings O1, O2, and O3 having different widths ($W_1 > W_2 > W_3$) and the same pitch P throughout the first to third regions I, II, and III. For example, the openings O1 of the first region may be arranged to have a first width $W_1$, and the openings O2 of the second region may be arranged to have a second width $W_2$ narrower than the first width $W_1$. In addition, the openings O3 of the third region may be arranged to have a third width $W_3$ narrower than the second width $W_2$. Under the same process conditions, diameters of the nanocores 25a-1, 25a-2, and 25a-3 of FIG. 5, maybe determined according to the widths ($W_1 > W_2 > W_3$) differently set by region.

The greater the diameters and heights of the nanocores 25a-1, 25a-2, and 25a-3, the lower the thicknesses of the active layers 25b-1, 25b-2, and 25b-3 grown on the surfaces of the nanocores 25a-1, 25a-2, and 25a-3 ($t_1 < t_2 < t_3$). For example, the quantum well thickness of the active layers 25b-2 of the second group may be greater than the quantum well thickness of the active layers 25b-1 of the first group, and smaller than the quantum well thickness of the active layers 25b-3 of the third group.

As described in this exemplary embodiment, when the emission wavelengths of the active layers 25b-1, 25b-2, and 25b-3 are designed only using the difference in surface area (diameter and/or height) of the nanocores without using the difference in pitch of the nanocores, the difference in surface area (diameter and/or height) between the groups may need to be secured in order to satisfy the wavelength conditions for implementing white light.

In some embodiments, the diameters $D_2$ and $D_3$ of the nanocores of the second and third groups may be at least 40% smaller than the diameters $D_1$ and $D_2$ of the nanocores of the first and second groups, respectively. In other embodiments, the heights $H_2$ and $H_3$ of the nanocores of the second and third groups may be at least 40% lower than the heights $H_1$ and $H_2$ of the nanocores of the first and second groups, respectively.

In addition, when the pitch P of the nanocores is significantly small, the quantum wells may not have different thicknesses according to the diameters ($D_1 > D_2 > D_3$) of the nanocores or, even in the case thereof, the difference in quantum well thicknesses may be insufficient. The pitch P of the nanocores may be designed to be greater than 1.5 μm in consideration of the effect of diameters ($D_1 > D_2 > D_3$) of the nanocores (please refer to FIG. 11 and the description thereof). For example, in order to obtain sufficient difference in the quantum well thicknesses, according to the difference in diameter of the nanocores, the pitch P of the nanocores may be designed to be greater than 1.8 μm.

In the exemplary embodiment, the nanocores of at least one of the first to third groups may be arranged to have a different pitch to that of the nanocores of another group. In this manner, by an additional use of the difference in pitch $P_i$, the emission wavelength of the active layers maybe designed to satisfy the conditions for obtaining preferred white light by group even when the difference in size of the nanocores is small. Such an exemplary embodiment is illustrated in FIG. 7.

Figure 7:
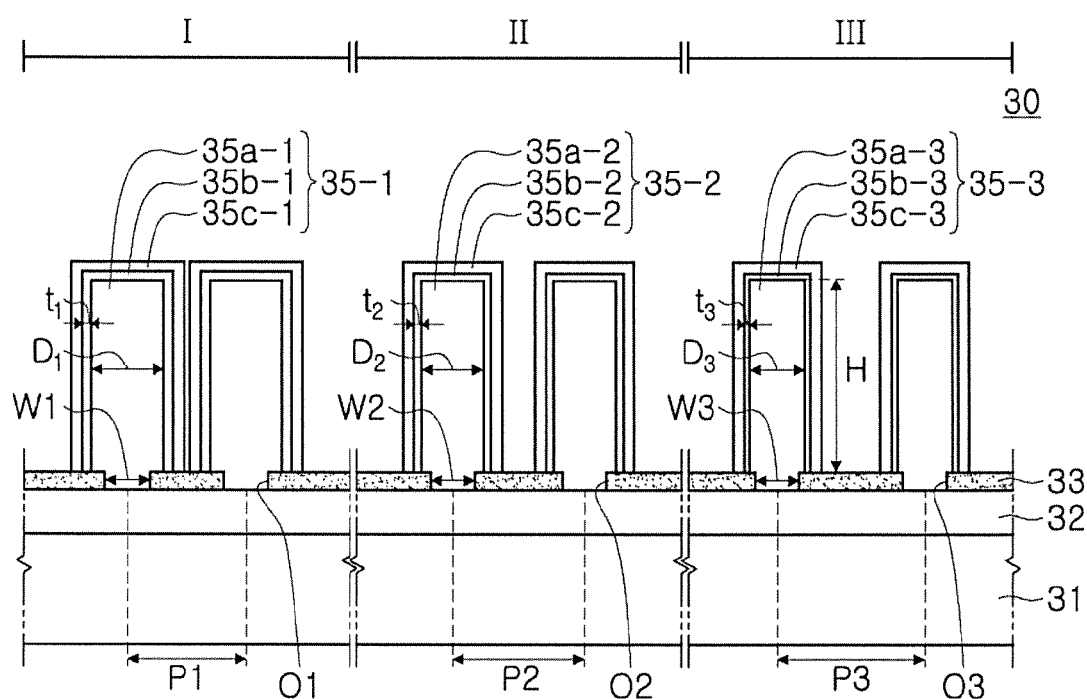
FIG. 7 is a cross-sectional view illustrating a nanostructure semiconductor light-emitting device according to an exemplary embodiment.
Figure 8A:
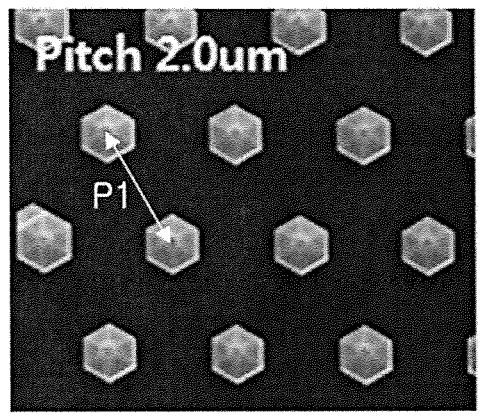
FIGS. 8A to 8D are photographs of planes of light-emitting nanostructures obtained from Experimental Example 1 (changes in pitch)
Figure 8B:
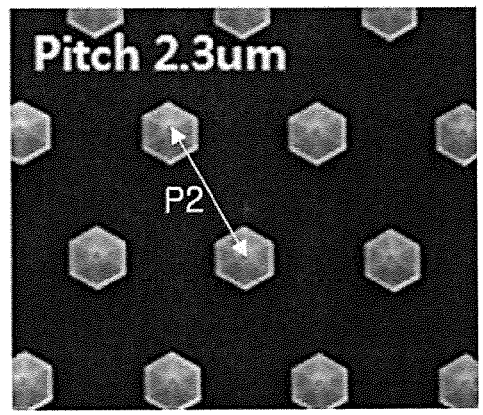
Figure 8C:
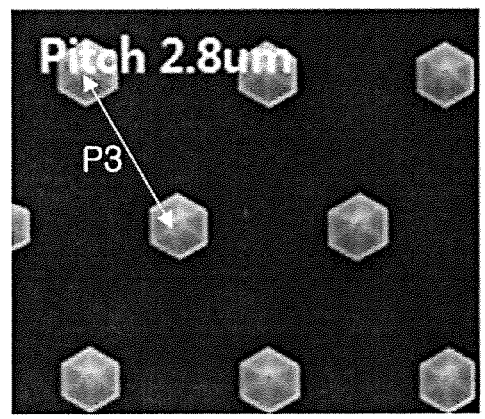
Figure 8D:
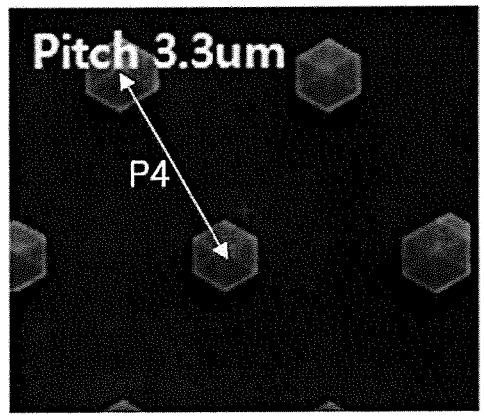

The nanostructure semiconductor light-emitting device 30 illustrated in FIG. 7, similar to the exemplary embodiments illustrated in FIGS. 2 and 5 may include abase layer 32 formed of a first conductivity-type semiconductor material, and a plurality of light-emitting nanostructures 35-1, 35-2, and 35-3 disposed on the base layer 32.

The nanostructure semiconductor light-emitting device 30 may include a substrate 31 having an upper surface on which the base layer 32 is disposed. The base layer 32 may provide a growth plane of the light-emitting nanostructures 35-1, 35-2, and 35-3. An insulating layer 33 may include a plurality of openings O1, O2, and O3 for growing nanocores 35a-1, 35a-2, and 35a-3.

The light-emitting nanostructures 35-1, 35-2, and 35-3 according to the exemplary embodiment of the present disclosure may be divided into three groups (first to third groups) according to the size of nanocores 35a-1, 35a-2, and 35a-3. The first to third groups of the light-emitting nanostructures 35-1, 35-2, and 35-3 may be respectively disposed on three regions I, II, and III formed by dividing an upper surface of the base layer 32.

The light-emitting nanostructures 35-1, 35-2, and 35-3 may include nanocores 35a-1, 35a-2, and 35a-3 formed of a first conductivity-type semiconductor, and active layers 35b-1, 35b-2, and 35b-3 and second conductivity-type semiconductor layer 35c-1, 35c-2, and 35c-3 sequentially formed on surfaces of the nanocores 35a-1, 35a-2, and 35a-3. Descriptions of components may be combined with descriptions of the components in the above exemplary embodiments as a reference, unless described otherwise In this exemplary embodiment, the active layers 35b-1, 35b-2, and 35b-3 may have different quantum well thicknesses $T_i$ by group in order to emit light having different wavelengths. As illustrated in FIG. 7, along with the sizes of the nanocores 35a-1, 35a-2, and 35a-3, the pitches of the nanocores 35a-1, 35a-2, and 35a-3 may differ by group ($P_1 < P_2 < P_3$). The size of nanocores may be controlled by using only one of diameter and height. That is, the size (or the surface area) of the nanocores may be controlled using the diameters ($D_1 > D_2 > D_3$) while maintaining the same height. Using such size and arrangement conditions, the quantum wells may be grown to have different thicknesses. Here, when changing the wavelength using the quantum well thickness, the size of the nanocores and the pitch of the nanocores have an opposite tendency. For example, when light having a long wavelength needs to be obtained by increasing the quantum well thickness, it is preferable to decrease the size (the diameter or the height) of the nanocores but to increase the pitch of the arrangement of the nanocores.

The pitches $P_1$, $P_2$, and $P_3$ of the nanocores 35a-1, 35a-2, and 35a-3 may be set to satisfy the above-described formulas (a), and (b-1) to (b-3). At least one of the diameters $D_1$, $D_2$, and $D_3$ and the height $H_1$, $H_2$, and $H_3$ of the nanocores 35a-1, 35a-2, and 35a-3 may be set to satisfy the above-described formulas (c) to (e-3).

In order to fabricate a semiconductor light-emitting device emitting white light, the quantum wells of the active layers 35b-1, 35b-2, and 35b-3 may be designed to emit light having wavelength bands corresponding to blue, green, and red.

For example, the emission wavelength of the active layers 35b-1 of the first group may be in the range of about 430 nm to about 480 nm, the emission wavelength of the active layers 35b-2 of the second group may be in the range of about 480 nm to about 540 nm, and the emission wavelength of the active layers 35b-3 of the third group may be in the range of about 540 nm to about 605 nm. As thicknesses conditions for satisfying the wavelength conditions, the quantum well thickness of the active layers 35b-1 of the first group maybe in the range of about 1 nm to about 5 nm, the quantum well thickness of the active layers 35b-2 of the second group may be in the range of about 1.5 nm to about 5.5 nm, and the quantum well thickness of the active layers 35b-3 of the third group may be in the range of about 2 nm to about 7.5 nm.

As described in the exemplary embodiment, by differently setting the pitches of the nanocores 35a-1, 35a-2, and 35a-3 ($P_1 < P_2 < P_3$) along with the sizes of the nanocores 35a-1, 35a-2, and 35a-3, the difference in emission wavelength between the active layers 35b-1, 35b-2, and 35b-3 may be more easily secured.

In order to find the changes in quantum well thicknesses and quantum well wavelength according to the changes in pitch and size of the nanocores, the following Experiment was been conducted.

Experiment 1: Changes According to the Change in Pitch of Nanocores

Nanocores were grown under the same process conditions using a mask including openings having the same diameter and different pitches.

More specifically, a $SiO_2$ mask was disposed on an n-GaN base layer, and openings having a diameter of about 820 nm were formed in the mask. The openings had different pitches (2.0 μm, 2.3 μm, 2.8 μm, and 3.3 μm) in four respective samples.

In the same MOCVD process conditions, n-GaN nanocores (diameter: 850 nm, height: 900 nm) were grown on each sample, and InGaN/GaN active layers and p-AlGaN/p-GaN layers were sequentially formed on surfaces of the nanocores of each sample.

FIGS. 8A to 8D are SEM photographs of planes of light-emitting nanostructures obtained from the samples. As illustrated in FIGS. 8A to 8D, the light-emitting nanostructures were only grown using the difference in pitch, and quantum well thicknesses of the active layers and wavelengths of light emitted from the active layers were measured. The results are listed in Table 3.

TABLE 3

| Items | Sample 1 | Sample 2 | Sample 3 | Sample 4 |
|---|---|---|---|---|
| Pitch (nm) | 2 | 2.3 | 2.8 | 3.3 |
| Thickness after Active Layer Growth (nm) | 920 | 980 | 1030 | 1170 |
| QW Thickness (nm) | 2.4 | 3.0 | 3.9 | 5.5 |
| Wavelength (nm) | 488 | 493 | 522 | 531 |

As listed in the above Table 3, it is found that as the pitch increases, the quantum well thickness increases from 2.4 nm to 5.5 nm even under the same growth process conditions. In particular, the quantum well wavelength also increases from 488 nm to 531 nm, that is, the quantum well wavelength becomes a long wavelength.

Figure 9:
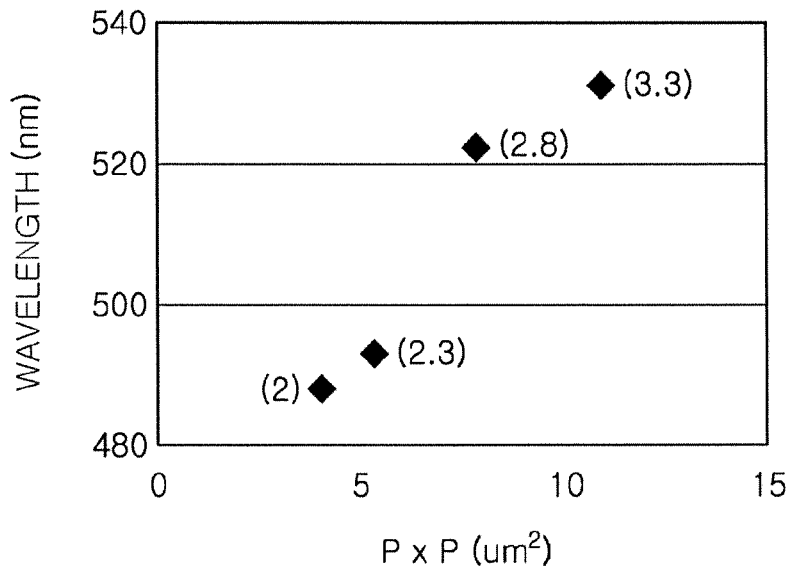
FIG. 9 is a graph illustrating emission wavelengths of light-emitting nanostructures obtained from the Experiment 1.

FIG. 9 is a graph illustrating the emission wavelengths of the light-emitting nanostructures obtained in the Experiment 1. Although the active layers grew in the same growth process conditions, each sample emits light having a different wavelength. That is, Samples 1 and 2 emit blue light while Samples 3 and 4 emit green light.

In addition, referring to FIG. 4, it is found that the thickness and wavelength of the Sample 1 are close to the line of indium content (x)=0.3, but the thickness and wavelength of the Sample 2 are close to the line of indium content (x)=0.35. Accordingly, it is found that even when grown in the same growth process conditions (that is, the same flow rate of indium source) the light-emitting nanostructures have different indium contents due to having different quantum well thicknesses. In addition, when the quantum well thickness is small, the indium content may be small and thus the wavelength may be short.

Experiment 2A: Changes According to the Change in Height of Nanocores

In the Experiment, a SiO$_2$ mask was disposed on an n-GaN base layer, and openings having a diameter of about 820 nm were formed to have a pitch of 2.5 μm in the mask.

In the same MOCVD process conditions, n-GaN nanocores (diameter: 850 nm) were grown on seven Samples, wherein the heights of the nanocores were different by Sample. Next, InGaN/GaN active layers and p-AlGaN/p-GaN layers were grown on surfaces of the nanocores of the Samples.

The heights of the nanocores of the Samples were measured as 420 nm, 600 nm, 610 nm, 730 nm, 920 nm, 940 nm, and 1000 nm on the basis of the same plane (m-plane).

Figure 10:
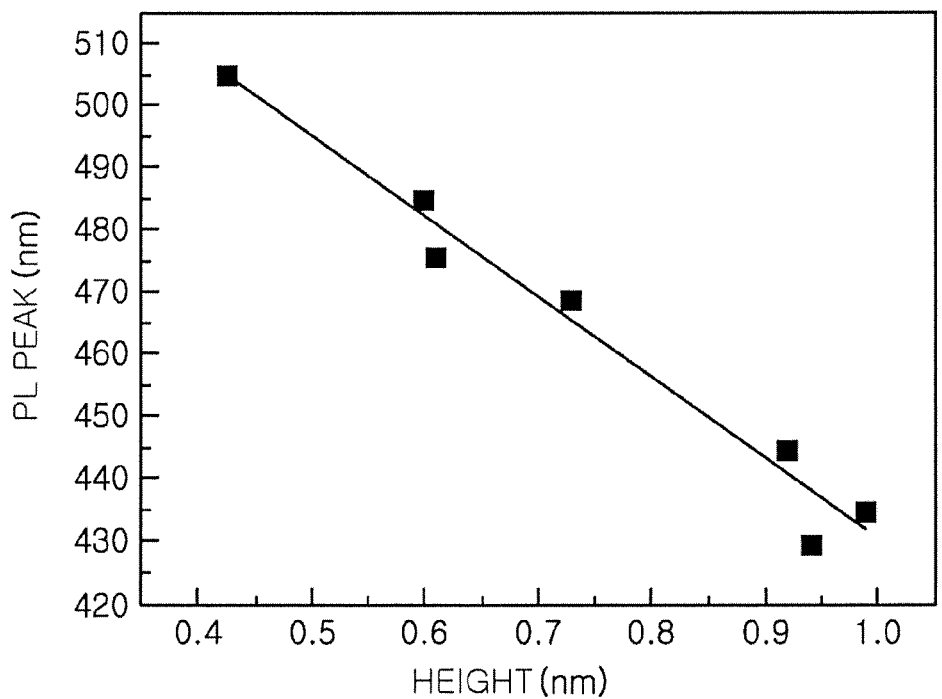
FIG. 10 is a graph illustrating PL peak wavelengths of light-emitting nanostructures obtained from Experiment 2 (changes in height)

PL peaks of active layers obtained from each Sample are illustrated in FIG. 10. Referring to FIG. 10, blue light having a PL peak of 430 nm to 445 nm is emitted when the height of the nanocores is 900 nm or more, but light having a PL peak of 505 nm is emitted when the height of the nanocores is 420 nm or more.

Experiment 2B: Changes According to the Change in Diameter of Nanocores

In this Experiment, a SiO$_2$ mask was disposed on an n-GaN base layer, and openings were formed in the mask to have different diameters at different pitches as listed in Table 2.

Next, n-GaN nanocores were grown to have different heights by Samples in the same MOCVD process conditions. Next, InGaN/GaN active layers and p-AlGaN/p-GaN layers were sequentially grown on surfaces of the nanocores.

Figure 11:
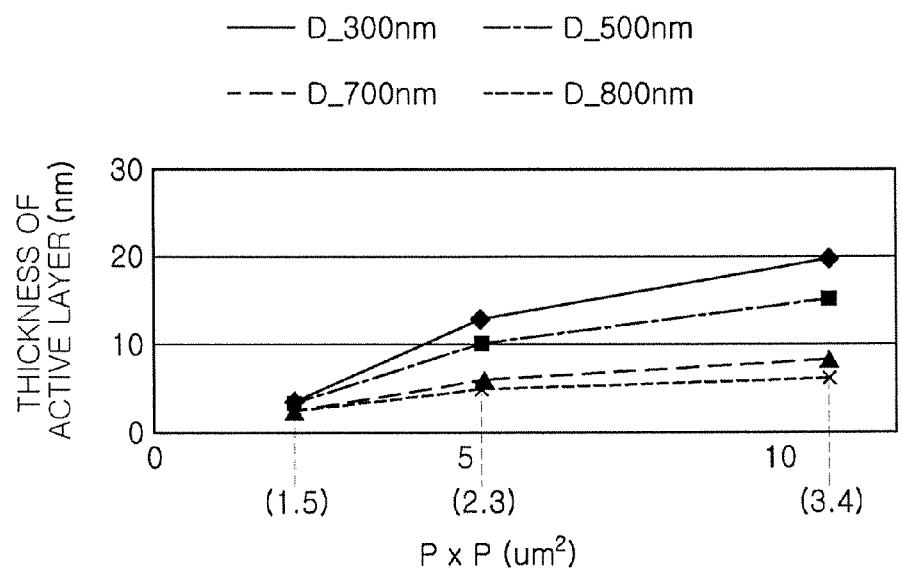
FIG. 11 is a graph illustrating changes in thickness of active layers according to diameters and pitches of nanocores, as a result of Experiment 3.

As a result, quantum well thicknesses are illustrated in the graph of FIG. 11 and listed in the following Table 4.

TABLE 4

| Items | Diameter 1 = 300 nm | Diameter 2 = 500 nm | Diameter 3 = 700 nm | Diameter 4 = 800 nm |
|---|---|---|---|---|
| Pitch 1 = 1.5 μm | QW Thickness = 2.4 nm | QW Thickness = 2.2 nm | QW Thickness = 2.3 nm | QW Thickness = 2.2 nm |
| Pitch 2 = 2.3 μm | QW Thickness = 12 nm | QW Thickness = 10 nm | QW Thickness = 6.2 nm | QW Thickness = 5.5 nm |
| Pitch 3 = 3.4 μm | QW Thickness = 20 nm | QW Thickness = 16 nm | QW Thickness = 8.3 nm | QW Thickness = 7.2 nm |

Referring to FIG. 11 along with Table 4, the greater the diameter of the nanocores, the greater the quantum well thickness. In particular, the changes in quantum well thickness according to the changes in diameter of the nanocores are more sensitive to pitch conditions. When the pitch is 1.5 μm, the changes in quantum well thickness according to the changes in diameter are not significant, while the changes in quantum well thickness according to the changes in diameter are significant. As the result of the Experiment, it is found that a remarkable effect in changing a quantum well (a wavelength) using a diameter of a nanocore can be expected when a pitch is 1.52 μm or more, preferably, 1.8 μm or more.

The nanostructure semiconductor light-emitting device according to the exemplary embodiment of the present disclosure may be fabricated in various processes. FIGS. 12A to 12F illustrate a process of growing nanocores using a method of filling a mask with the nanocores using the mask as a mold, as an example of a method of fabricating a nanostructure semiconductor light-emitting device. In addition, in the exemplary embodiment, an emission wavelength of a quantum well may be changed by controlling a pitch in each region, similar the example illustrated in FIG. 2.

Figure 12A:
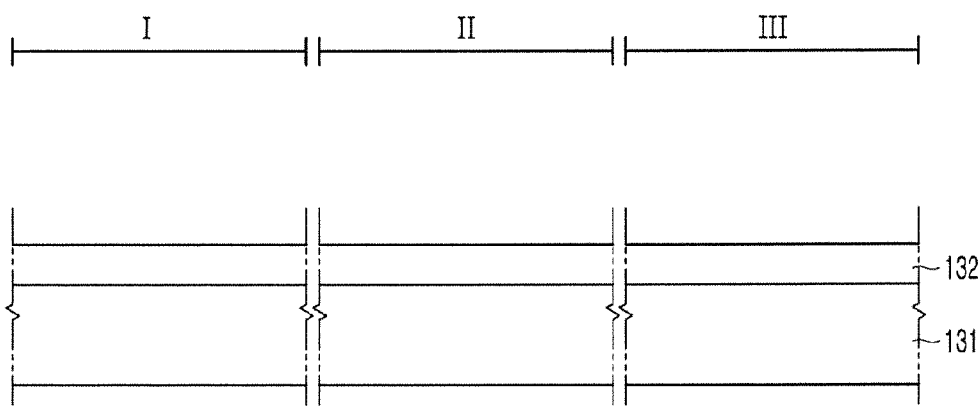
FIGS. 12A to 12F are cross-sectional views illustrating a process of fabricating a nanostructure semiconductor light-emitting device according to an exemplary embodiment.

As illustrated in FIG. 12A, a base layer 132 may be prepared by growing a first conductivity-type semiconductor on a substrate 131.

The base layer 132 may have an upper surface divided into first to third regions I, II, and III, and a plurality of light-emitting nanostructures emitting light having different wavelengths may be disposed on the first to third regions I, II, and III. In this exemplary embodiment, the light-emitting nanostructures may be obtained by controlling a pitch of the nanocores. In order to obtain white light, each of the first to third regions I, II, and III may be prepared to have different sizes or shapes, by considering light emitting efficiency or the number of distribution of the light-emitting nanostructures in each group.

The base layer 132 may provide a crystal growth plane for growing the light-emitting nanostructures, and function to electrically connect the same polarities of the light-emitting nanostructures to each other. Accordingly, the base layer 132 may have an electrically conductive semiconductor single crystal structure. In the case that the base layer 132 is directly grown on the substrate 131, the substrate 131 may be a crystal growth substrate. A multilayer structure including a buffer layer formed of Al$_x$In$_y$Ga$_{1-x-y}$N (0≤x≤1, 0≤y≤1, and 0≤x+y≤1) may be additionally formed on the substrate 131, before the base layer 132 is grown. The multilayer structure may include intermediate layers consisting of an undoped GaN layer, an AlGaN layer, or a combination thereof in order to prevent current leakage from the base layer 132 to the buffer layer and improve crystal quality of the base layer 132.

Figure 12B:
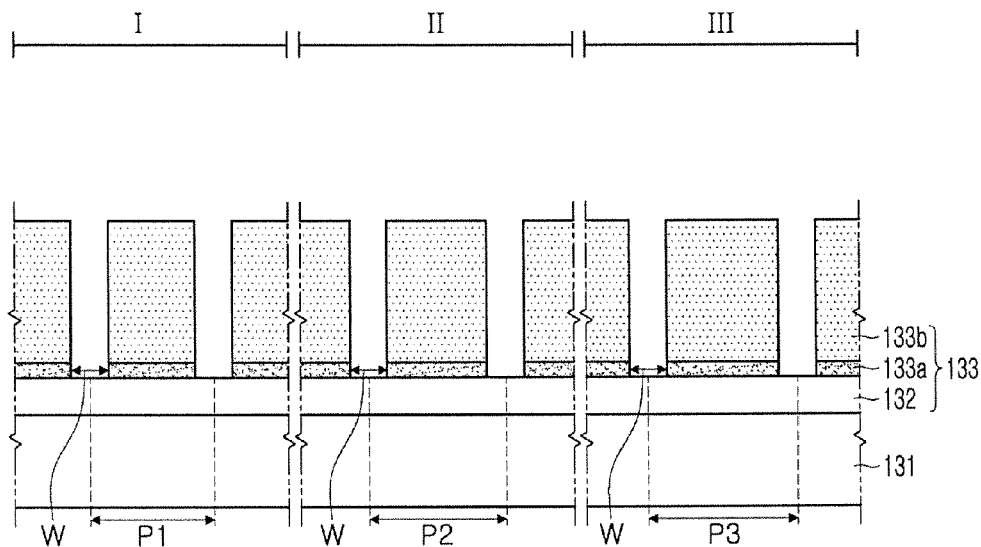

Next, as illustrated in FIG. 12B, a mask 133 including a plurality of openings O and an etch stop layer may be formed on the base layer 132.

The mask 133 according to an exemplary embodiment of the present disclosure may include a first material layer 133a formed on the base layer 132, and a second material layer 133b formed on the first material layer 133a and having a greater etch rate than the first material layer 133a.

The first material layer 133a may be provided as the etch stop layer. That is, the first material layer 133a may have a lower etch rate than the second material layer 133b in conditions of etching the second material layer. At least the first material layer 133a is an electrically insulating material and, as needed, the second material layer 133b maybe an insulating material.

The insulating layer 133 may include openings O having the same width W, formed at different pitches (P$_1$<P$_2$<P$_3$) over the first to third regions I, II, and III. For example, opening patterns in the first region I maybe arranged at a first pitch P$_1$, opening patterns in the second region II may be arranged at a second pitch P$_2$ greater than the first pitch P$_1$. In addition, opening patterns in the third region III may be arranged at a third pitch P$_3$ greater than the second pitch P$_2$. Conditions of the pitches may be set to satisfy the conditions of the above-described formulas (a), and (b-1) to (b-3).

In this exemplary embodiment, the first and second material layers 133a and 133b may be formed of different materials from each other in order to obtain preferred each rate differences. For example, the first material layer 133a may be a SiN-based material, and the second material layer 133b may be SiO$_2$. Alternately, the etch rate difference may be obtained using a pore density. That is, the second material layer 133b, or both first and second material layers 133a and 133b may be formed of a porous material, and the etch rate difference between the first and second material layers 133a and 133b may be secured by controlling the difference in porosity. In this case, the first and second material layers 33a and 33b may be formed of the same material. For example, the first material layer 133a may be SiO$_2$ having a first porosity, and the second material layer 133b may be SiO$_2$, which is the same material as the first material layer 133a but has a second porosity greater than the first porosity. Accordingly, the first material layer 133a has a lower etch rate than the second material layer 133b in the conditions of etching the second material layer 133b.

The total thickness of the first and second material layers 133a and 133b may be designed in consideration of a preferred height of the light-emitting nanostructure. An etch-stop level by the first material layer 133a may be designed in consideration of a total height of the mask 133 from a surface of the base layer 132. The first and second material layers 133a and 133b may be sequentially formed on the base layer 132, and a plurality of openings O may be formed to expose the base layer 132. The formation of the openings O may include forming a photoresist on the mask 133 and performing a lithography process and a wet/dry etching process using the photoresist. The size of each of the openings O may be designed in consideration of a preferred size of the light-emitting nanostructure. For example, the openings O exposing the surface of the base layer 132 may have a width W of 600 nm or less, and preferably 50 to 500 nm, but are not limited thereto.

The openings O may be fabricated using a semiconductor process. For example, the openings O having a high aspect ratio may be formed using a deep-etching process. The aspect ratio of the openings O may be 3:1 or more, and preferably 10:1 or more.

Figure 13A:
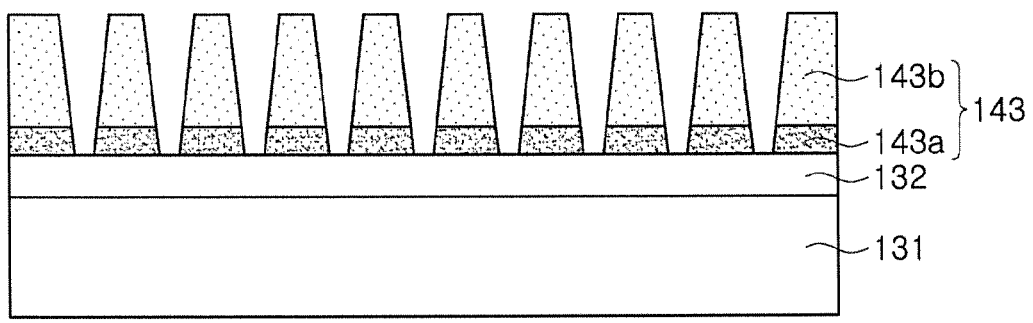
FIGS. 13A and 13B are cross-sectional views illustrating shapes of openings of an insulating layer illustrated in FIG. 12B.

Normally, the openings O in the first and second material layers 133a and 133b may have, but are not limited to, a tapered width toward the base layer 132 (please refer to FIG. 13A).

Normally, the deep-etching process may be a dry-etching process, and use reactive ions generated from a plasma state, or an ion beam generated in a high vacuum state. Compared to a wet-etching process, such a dry etching process may allow precise processing to be performed on a fine structure with no geometric limitation. A CF-based gas may be used to etch an oxide layer of the mask 133. For example, an etchant in which at least one of O$_2$ and Ar is combined with a gas such as CF$_4$, C$_2$F$_6$, C$_3$F$_8$, C$_4$F$_8$, or CHF$_3$ may be used.

Figure 13B:
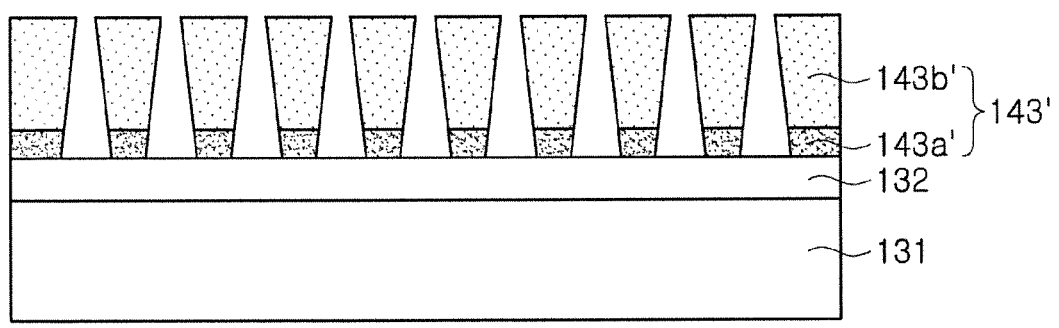

The openings O may be implemented in various planar shapes and arrangements. For example, the planar shape of the openings O may be not only a circular or hexagonal shape, but also a polygonal, tetragonal, or oval shape. The openings O are illustrated as having a rod structure with a constant diameter (or width) in FIG. 12B, but are not limited thereto. The openings O may have a variety of structures using an appropriate etching process. For example, masks having openings O with different shapes are illustrated in FIGS. 13A and 13B. In FIG. 13A, a mask 143 formed of first and second material layers 143a and 143b may include pillar-shaped openings O having upwardly increasing cross-sectional areas. In FIG. 13B, a mask 143' formed of first and second material layers 143a' and 143b' may include pillar-shaped openings O having upwardly decreasing cross-sectional areas.

Figure 12C:
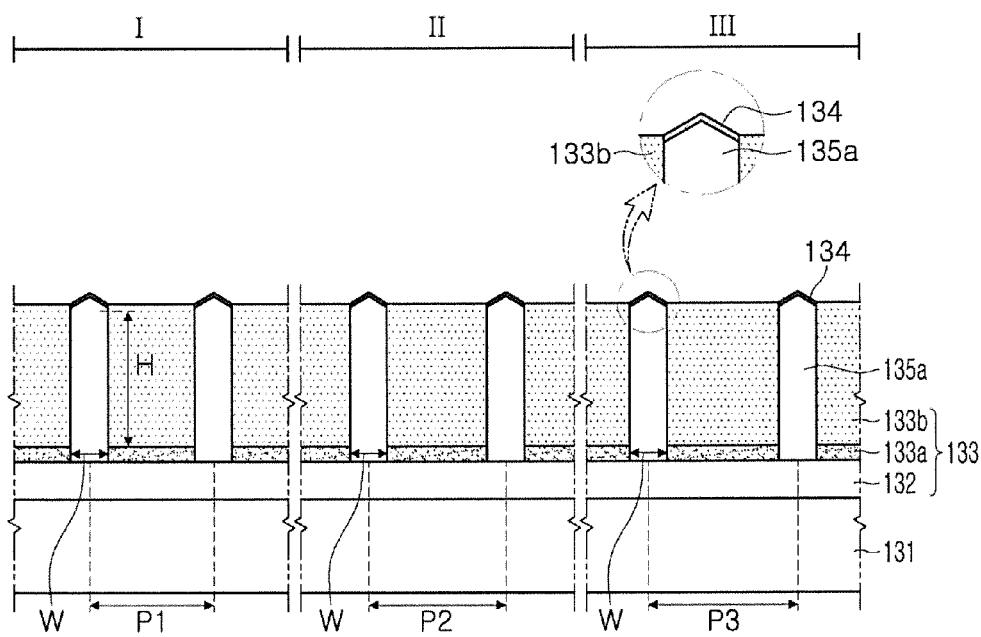

Next, as illustrated in FIG. 12C, a first conductivity-type semiconductor may be grown on the exposed base layer 132 to fill the openings O and form a plurality of nanocores 135a, and then a current-blocking intermediate layer 134 may be formed on a top T of the nanocores 135a.

The first conductivity-type semiconductor of the nanocores 135a may be an n-type nitride semiconductor, and formed of the same material as the first conductivity-type semiconductor of the base layer 132. For example, the base layer 132 and the nanocores 135a may be formed of n-type GaN.

A nitride single crystal configuring the nanocores 135a may be formed through an MOCVD or MBE process, and the mask 133 may function as a mold for growing the nitride single crystal. Thus, the nanocores 135a corresponding to the openings O may be provided. That is, the nitride single crystal is selectively grown on the base layer 132 exposed by the mask 133 in the openings O, and thus fills the openings O. Accordingly, the filling nitride single crystal may have a shape corresponding to the shape of the openings O. Accordingly, although the nanocores 135a formed in each region are arranged with a different pitch ($P_1 < P_2 < P_3$), the nanocores 135a have the same size (the same diameter and the same height).

A current-blocking intermediate layer 134 may be formed on the top surface T of the nanocores 135a while the mask 133 remains. Accordingly, the current-blocking intermediate layer 134 may be easily formed without any additional mask-forming process.

The current-blocking intermediate layer 134 may be an intentionally undoped semiconductor layer, or a semiconductor layer doped with second conductivity-type impurities opposite to the impurities of the nanocores 135a. For example, in the case that the nanocores 135a are the n-type GaN, the current-blocking intermediate layer 134 maybe undoped GaN, or GaN doped with p-type impurities such as Mg. In this case, the nanocores 135a and the current-blocking intermediate layer 134 may be successively formed by changing the type of impurities during the same process. Thus, the process of forming the current-blocking intermediate layer 134 and the molding process are combined to simplify the entire process.

Figure 12D:
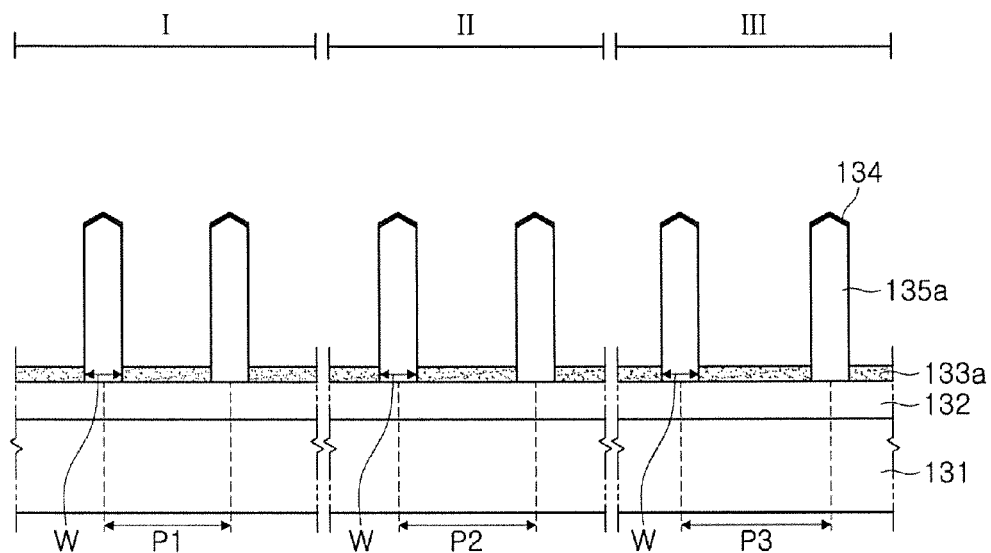

Next, as illustrated in FIG. 12D, the mask 133 is removed to reach the first material layer 133a, that is, the etch stop layer, and partially expose side surfaces of the plurality of nanocores 135a.

In this exemplary embodiment, by applying an etching process in which the second material layer 133b is selectively removed, the second material layer 133b may be removed while the first material layer 133a remains. The remaining first material layer 133a may function to prevent active layers 135b and second conductivity-type semiconductor layers 135c from being connected to the base layer 132 in the subsequent process.

Figure 12E:
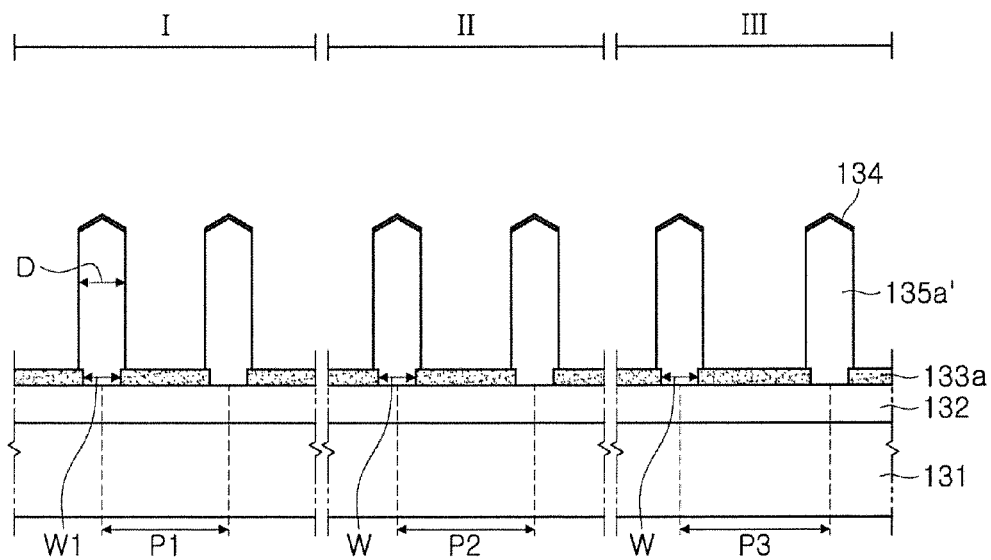

Next, as illustrated in FIG. 12E, the upper layer of the mask 133 may be removed after the process of growing the nanocores 135a is finished. Then, a heat treatment or a regrowth process maybe performed on surfaces of the nanocores 135a in order to convert crystal planes of the nanocores 135a to semi-polar or non-polar crystal planes, which are advantageous and stable for crystal growth. The process will be described with reference to FIGS. 14A and 14B.

Figure 14A:
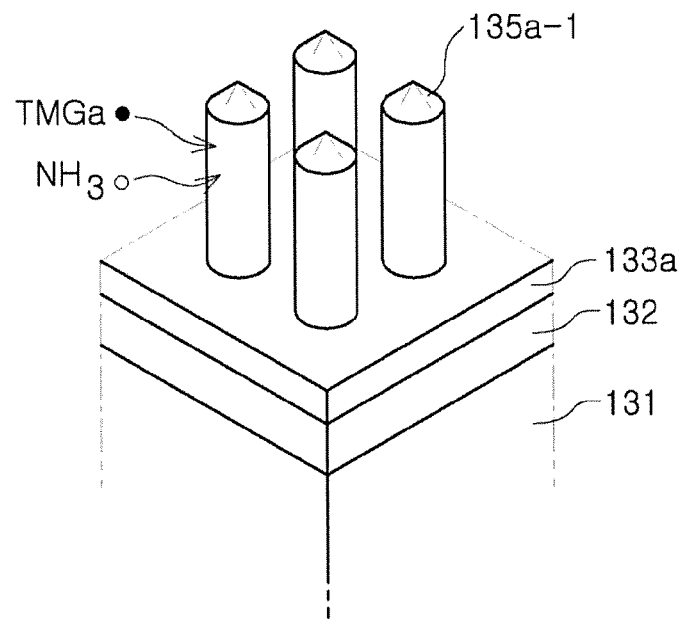
FIGS. 14A and 14B are schematic views illustrating heat treatment or regrowth processes applicable to the process of FIGS. 12D and 12E, respectively.
Figure 14B:
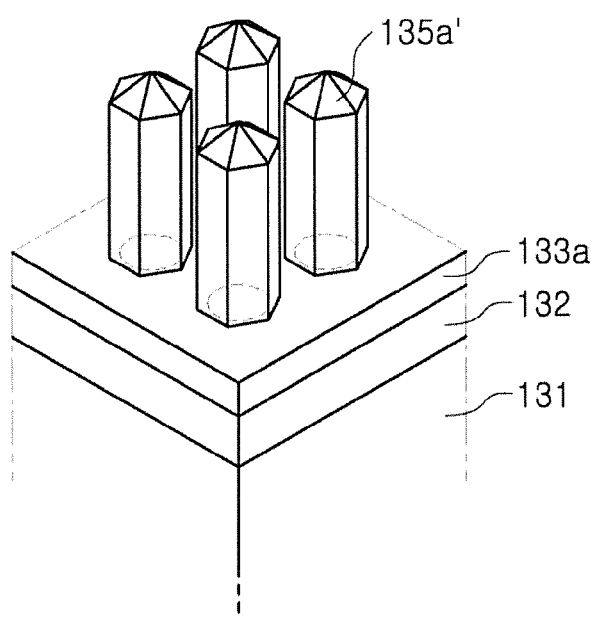

FIGS. 14A and 14B are schematic views illustrating heat treatment or regrowth processes applicable to the processes of FIGS. 12D and 12E, respectively. FIG. 14A may be understood as illustrating the nanocores 135a obtained in the process of FIG. 12d. The nanocores 135a may have a crystal plane determined depending on the shape of the openings O. Although it depends on the shape of openings O, the surfaces of the nanocores 135a obtained in such a manner may have relatively unstable crystal planes, which is not a favorable condition for the subsequent crystal growth process.

In this exemplary embodiment, when the openings O have a cylindrical rod shape as illustrated in FIG. 14A, side surfaces of the nanocores 135a may have not specific crystal planes but curved surfaces.

These unstable crystals of the curved surfaces are rearranged to form stable semi-polar or non-polar crystal planes by performing the heat treatment or the regrowth process on the nanocores 135a. As for the heat treatment, the nanocores 135a may be heat-treated at a temperature of 600° C. or more, more specifically 800° C. to 1200° C. for several seconds to several tens of minutes, and thereby the unstable crystal planes are converted to stable crystal planes.

When the temperature of a substrate is lower than 600° C. during the heat treatment process, it may be difficult to expect the effect of the heat treatment since the nanocores are hard to grow and to be rearranged, and when the temperature of a substrate is higher than 1200° C., the quality of the crystals may be degraded since nitrogen (N) may be evaporated from the GaN crystal plane. In addition, it is difficult to expect a sufficient effect of the heat treatment for a short time less than one second, and the efficiency of a manufacturing process may be degraded in the case that the heat treatment is performed for several tens of minutes, for example, for 60 minutes or more.

The regrowth process introduced in this step may be performed under conditions similar to those for growing the nanocores 135a. For example, an n-type GaN may be regrown on the surfaces of the nanocores 15a by resuming MOCVD process under conditions similar to those for growing an n-type GaN for the nanocores 135a after removing mask.

For example, when the nanocores 135a are grown on a C(0001) plane of the sapphire substrate (or a (111) plane of a silicon substrate), the cylindrical shaped nanocores 135a at the illustrated in FIG. 14A having unstable circular crystal planes (side surfaces) may be converted hexagonal crystal pillars (135a' of FIG. 14B) having stable planes, that is, non-polar crystal planes (m-planes) by performing the heat treatment or the regrowth process at the above-described appropriate conditions (e.g. temperature). Thus, the stabilization of the crystal planes may be implemented by the high-temperature heat treatment process.

Although the principle of the changes is difficult to be clearly explained, it may be understood that crystals located in the surfaces are rearranged at the high temperature, or remaining source gases in the chamber are deposited and partially re-grown to form stable crystal planes.

In particular, when the regrowth process may be performed, as illustrated in FIG. 14A, TMGa and NH₃ may be supplied into an MOCVD chamber and the supplied TMGa and NH₃ may be reacted on the surfaces of the nanocores 135a to perform regrowth for stable crystal planes. Due to this regrowth, widths of the regrown nanocores 135a' may be slightly increased, relative to those of the nanocores 135a prior to the heat-treatment or the regrowth process (please refer to FIGS. 14A and 14B).

In this manner, crystallinity of the nanocores may be improved by introducing the heat treatment or the regrowth process. That is, through the heat treatment process, not only non-uniformity (e.g. defects) in the surfaces of the nanocores after the removal of the mask may be removed, but also stability of the crystal may be significantly improved due to rearrangement of the internal crystal structure. Although, in FIG. 12E, the nanocores 135a' are illustrated as having the same diameter D after the heat treatment process, the nanocores 135a' may have different diameters by group since the amount of re-growth during the heat treatment process may be different, even if the difference is not so significant (e.g. 10 nm or less). For example, when the nanocores have a large pitch, the diameter of the nanocores may increase since the amount of re-growth increases.

In some embodiments, in consideration of the difference in diameter due to the re-growth, the openings O may have different widths so that the nanocores 135a' have the same diameter regardless of the groups after the heat treatment or the regrowth process is performed. For example, in consideration of the amount of re-growth, openings O of a group having a large pitch may be greater than openings O of a group having a small pitch.

Figure 12F:
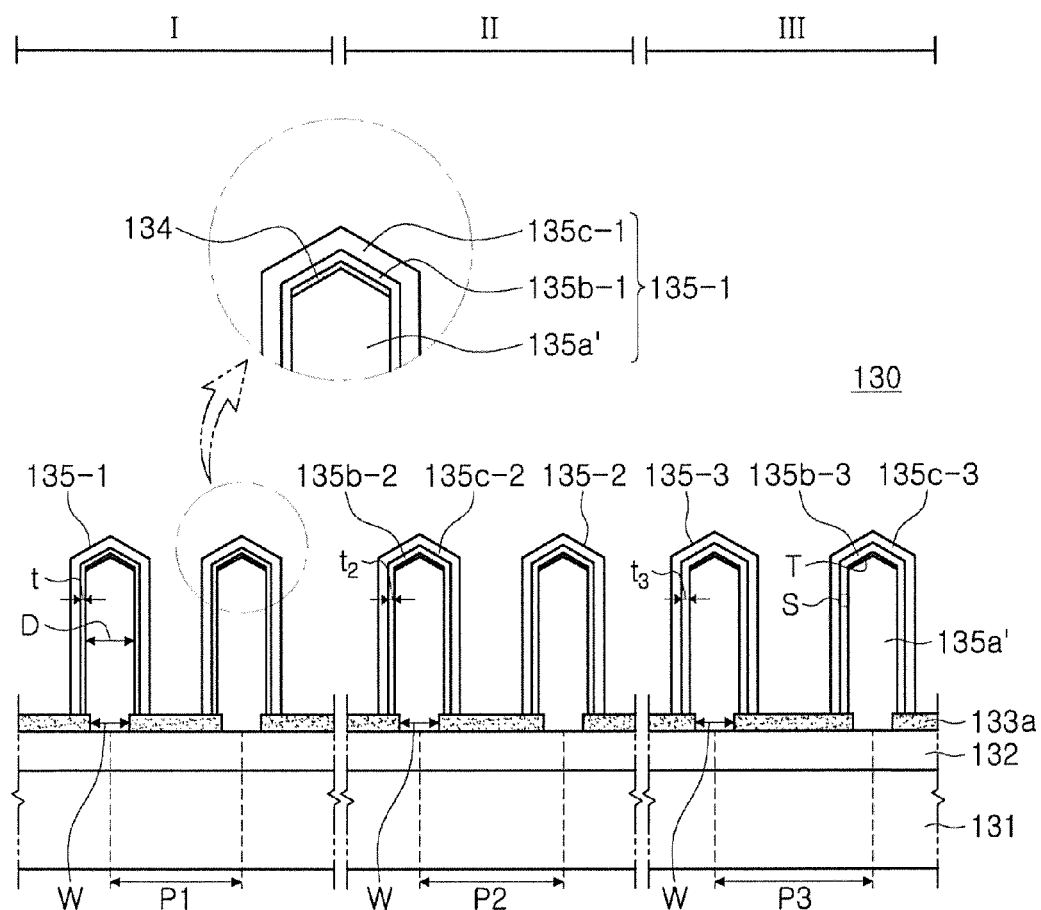

Next, as illustrated in FIG. 12F, active layers 135b-1, 135b-2, and 135b-3 and second conductivity-type semiconductor layers 135c-1, 135c-2, and 135c-3 may be sequentially formed on surface of the plurality of nanocores 135a'.

The process is performed on the nanocores 135a' disposed in the entire regions I, II, and III under the same conditions, similar to the growth process and heat treatment or regrowth process of the nanocores. That is, the process is performed in the same chamber by supplying source gases at the same flow rate under the same temperature and pressure conditions. In spite of the same process conditions, since the pitches of the nanocores 135a' are different in different regions I, II, and III, layers grown on the surfaces of the nanocores 135a', in particular, the active layers 135b-1, 135b-2, and 135b-3 may have different thicknesses ($t_1 < t_2 < t_3$) in different regions I, II, and III. In addition, since the thicknesses of quantum wells are different by regions, compositions (e.g. indium content) of the quantum wells may be different by regions. As a result, the active layers 135b-1, 135b-2, and 135b-3 obtained from the respective regions I, II, and III may emit light having different wavelengths.

For example, the active layers 135b-1 disposed at the smallest first pitch $P_1$ on the first region I may have thin quantum wells and emit short-wavelength light such as blue. In addition, the active layers 135b-3 disposed at the largest third pitch $P_3$ on the third region III may have thick quantum wells and emit long-wavelength light such as red. Further, the active layers 135b-3 disposed at an intermediate second pitch $P_2$ on the second region II may emit intermediate-wavelength light such as green.

Accordingly, through the process, the light-emitting nanostructures 135 may have a core-shall structure including the nanocores 135a' formed of a first conductivity-type semiconductor layers, the active layers 135b-1, 135b-2, and 135b-3 surrounding the nanocores 135a', and shell layers formed of the second conductivity-type semiconductor layers 135c-1, 135c-2, and 135c-3.

The nanocores 135a' may include upper end portions having different crystal planes from those of the side surfaces thereof. As described above, the active layers and second conductivity-type semiconductor layers formed on the upper end portions T may have a different composition and/or thickness from the active layers and second conductivity-type semiconductor layers formed on side surfaces (S). In order to solve leakage currents and problems in a light emission wavelength, a current-blocking intermediate layer 134 may be disposed on the upper end portions of the nanocores 135a. Due to the selective disposition of the current-blocking intermediate layer 134, current flow through the active layers formed on the upper end portions of the nanocores 135a' may be blocked by the current-blocking intermediate layer 134, while ensuring normal current flow through the active layers formed on the side surfaces of the nanocores 135a'.

Thus, by suppressing the leakage currents concentrated in the upper end portions of the nanocores 135a', internal quantum efficiency may be improved and, at the same time, a preferred light-emission wavelength may be precisely designed.

The mask in the above-described embodiment is illustrated as consisting of two material layers, but the inventive concept is not limited thereto. In some embodiments, the mask layers may consist of three or more material layers.

For example, in the case that the mask includes first to third material layers sequentially stacked on the base layer, the second material layer may function as an etch stop layer and include a different material from the first and third material layers. As needed, the first and third material layers may be formed of the same material.

Under the conditions of etching the third material layer, since at least the second material layer has a lower etch rate than the third material layer, the second material layer may function as an etch stop layer. At least the first material layer may be an electrically insulating material, and the second or third material layers may also be an insulating material, as needed.

As various specific processes according to exemplary embodiments, a nanocore forming process including formation of a current-blocking intermediate layer using a mask illustrated in FIG. 13A and a heat treatment or a regrowth process will be described with reference to FIGS. 15A to 15D.

Figure 15A:
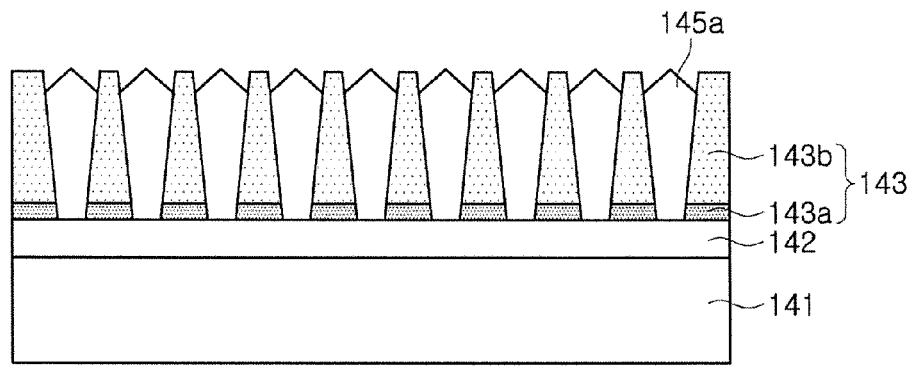
FIGS. 15A to 15D are cross-sectional views illustrating main processes in a method of fabricating a nanostructure semiconductor light-emitting device according to an exemplary embodiment (changes in the mask structure)

As illustrated in FIG. 15A, nanocores 145a may be grown on a base layer 142 using a mask 143. The mask 143 may have downwardly tapered openings. The nanocores 145a may be grown to have a shape corresponding to the shape of the openings.

In order to improve the crystal quality of the nanocores 145a, one or more heat treatment processes may be introduced during the growth process. In particular, since upper surfaces of the nanocores 145a are rearranged to be on crystal planes of hexagonal pyramids during the growth process, the nanocores 145a may have a more stable crystal structure, and a crystal subsequently grown thereon may also have high quality.

Such a heat treatment process may be performed at the above-described temperature. For example, the heat treatment process may be performed at a temperature the same as or similar to the temperature of the nanocores 145a growth process for the convenience of the process. Alternately, the heat treatment process may be performed under an $NH_3$ atmosphere without supplying a metal source such as TMGa, while maintaining a pressure/temperature to be the same as or a similar to the pressure/temperature of the nanocores growth process. The heat treatment may be performed for several seconds to several tens of minutes (e.g. 5 seconds to 30 minutes), but is not limited thereto. A sufficient effect may be expected by maintaining the heat treatment process for about 10 seconds to about 60 seconds.

In this manner, since the heat treatment process introduced to the process of growing the nanocores 145a serves to prevent deterioration of crystallinity due to a rapid growth of the nanocores 145a, a rapid crystal growth along with high crystal quality may be achieved.

The number and times of the heat treatment processes may be variously changed depending on the final height and diameter of the nanocores. For example, when a width of the openings is 300 to 400 nm, and a height of the openings (a thickness of the mask) is about 2.0 μm, nanocores having a preferred quality may be grown by inserting a stabilization time for about 10 seconds to about 60 seconds at an intermediate height, that is, about 1.0 μm. It will be obvious that such a stabilization process may be omitted depending on the conditions of a nanocore growth process.

Figure 15B:
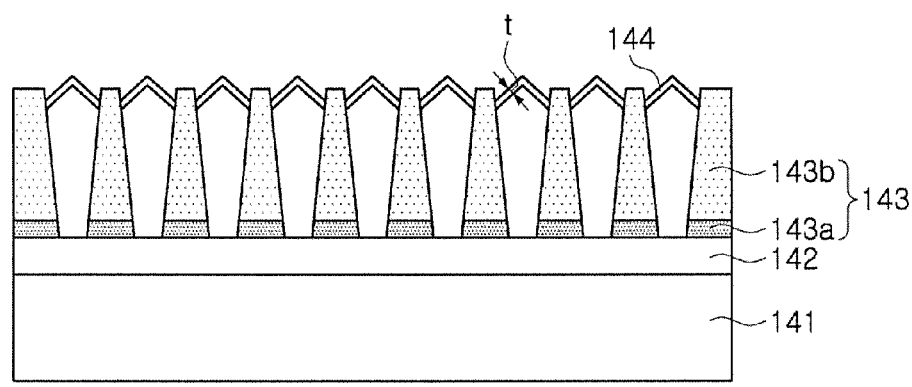

Next, as illustrated in FIG. 15B, a current-blocking intermediate layer 144 as a high resistance component, may be formed on upper surfaces of the nanocores 145a.

After the nanocores 145a having a preferred height are formed, the current-blocking intermediate layer 144 maybe formed on the upper surfaces of the nanocores 145a while the mask 143 remains intact. Accordingly, the current-blocking intermediate layer 144 may be easily formed on preferred portions (upper surfaces) of the nanocores 145a using the mask 143 as it is, with no additional mask formation process.

The current-blocking intermediate layer 144 maybe an intentionally undoped semiconductor layer, or a semiconductor layer doped with second conductivity-type impurities opposite to the impurities of the nanocores 145a. For example, when the nanocores 145a are n-type GaN, the current-blocking intermediate layer 144 may be undoped GaN, or GaN doped with p-type impurities such as Mg. In this case, the nanocores 145a and the current-blocking intermediate layer 144 may be successively formed by converting only the type of impurities in the same growth process. For example, the current-blocking intermediate layer 144 may have a thickness t of about 200 nm to about 300 nm when grown for about one minutes under the same conditions as the n-type GaN nanocore growth process, except that Mg is injected instead of Si. Such a current-blocking intermediate layer 144 may effectively block leakage currents of several μA or more. Thus, the process of forming the current-blocking intermediate layer 144 may be easily implemented in a molding method according the exemplary embodiment of the present disclosure.

Figure 15C:
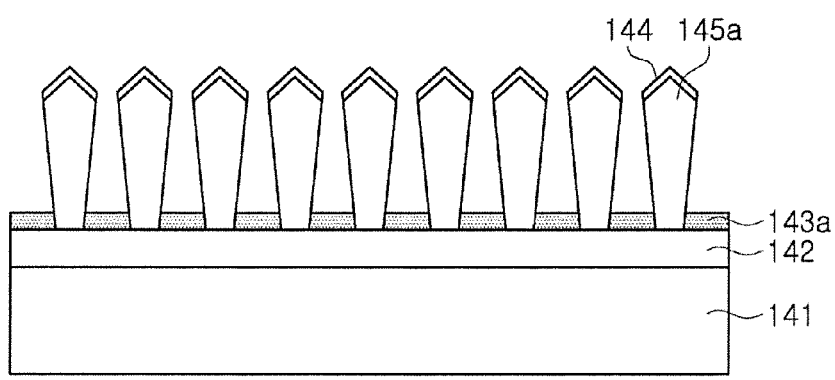

Next, as illustrated in FIG. 15C, the mask 143 may be removed to the etch stop layer, that is, the first material layer 143a until side surfaces of the plurality of nanocores 145a are exposed.

In this exemplary embodiment, only the second material layer 143b may be removed while the first material layer 143a remains, by applying a process of selectively removing the second material layer 143b. The remaining first material layer 143a may function to prevent active layers and second conductivity-type semiconductor layers from being in contact with the base layer 142 in the subsequent process.

In the process of fabricating the light-emitting nanostructures according to the exemplary embodiment of the present disclosure, an additional heat treatment or regrowth process may be introduced in order to improve crystallinity.

Figure 15D:
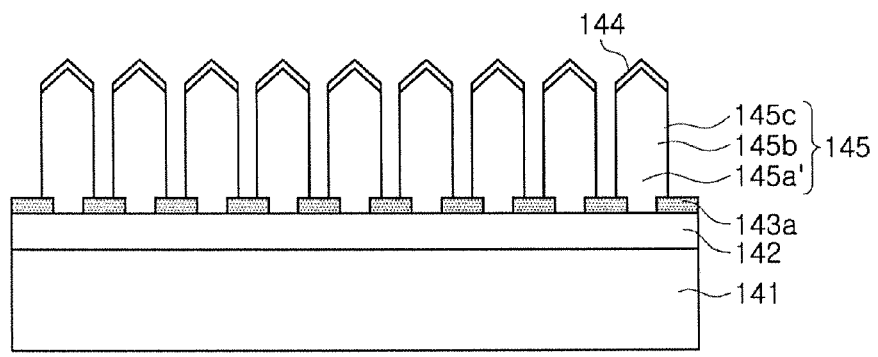

After the second material layer 143b of the mask 143 is removed, surfaces of the nanocores 145a may be subjected to a heat treatment or a regrowth process in certain conditions in order to convert unstable crystal planes of the nanocores 145a to stable crystal planes (please refer to the descriptions with reference to FIGS. 14A and 14B). For example, the regrowth process may be performed under conditions similar to those for growing the nanocores 45a. For example, an n-type GaN may be regrown on the surfaces of the nanocores 145a by using MOCVD process under conditions similar to those for growing an n-type GaN for the nanocores 145a. In particular, in this exemplary embodiment, since the nanocores 145a are grown in the openings having tapered sidewalls, the nanocores 145a may have tapered sidewalls. However, as illustrated in FIG. 15D, after the heat treatment or the regrowth process, the nanocores 145a' may have a uniform diameter (or a width) greater than the diameter of the openings due to crystal re-growth along with crystal re-arrangement. In addition, upper end portions of the nanocores 145a just after the crystal growth process may have an unstable hexagonal pyramid shape, but upper end portions of the nanocores 145a' after the heat treatment process may have a stable hexagonal pyramid shape. Thus, the nanocores 145a having non-uniform widths after the removal of the mask 143 may be re-grown (and/or rearranged) to be the nanocores 145a' having a uniform width and a stable crystal planes in a hexagonal pyramid pillar shape, through the heat treatment or the regrowth process.

FIGS. 16A to 16E illustrate a method of fabricating a nanostructure semiconductor light-emitting device according to another exemplary embodiment of the present disclosure. Referring to FIGS. 16A to 16E, sizes (e.g. diameters) of nanocores is controlled by region to change a wavelength of light emitted by a quantum well.

Figure 16A:
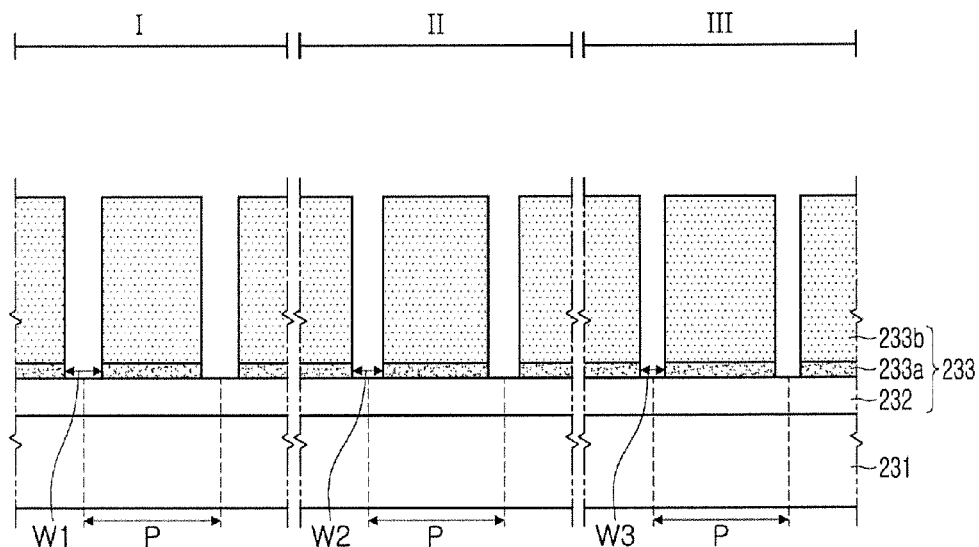
FIGS. 16A to 16E are cross-sectional views illustrating a process of fabricating a nanostructure semiconductor light-emitting device according to an exemplary embodiment.

As illustrated in FIG. 16A, a base layer 232 is provided by growing a first conductivity-type semiconductor on a substrate 231, and a mask 233 having a plurality of openings O1, O2, and O3 and an etch stop layer is formed on the base layer 232.

The mask 233 according to the exemplary embodiment of the present disclosure may include a first material layer 233a formed on the base layer 232, and a second material layer 233b formed on the first material layer 233a and having a greater etch rate than the first material layer 233a.

The base layer 232 may have an upper surface divided into first to third regions I, II, and III. The plurality of openings O1, O2, and O3 respectively formed on the first to third regions I, II, and III are arranged to have the same pitch P and different widths $W_1$, $W_2$, and $W_3$ by region. For example, openings O1 of the first region I may have a first width $W_1$, and openings O2 of the second region II may have a second width $W_2$ narrower than the first width $W_1$. In addition, the openings O3 of the third region III may have a third width $W_3$ greater than the second width $W_2$. The width of the openings O1, O2, and O3 may be set in such a manner that the final diameters $D_1$, $D_2$, and $D_3$ of the nanocores satisfy the above-described formulas (c), and (e-1) to (e-3).

Figure 16B:
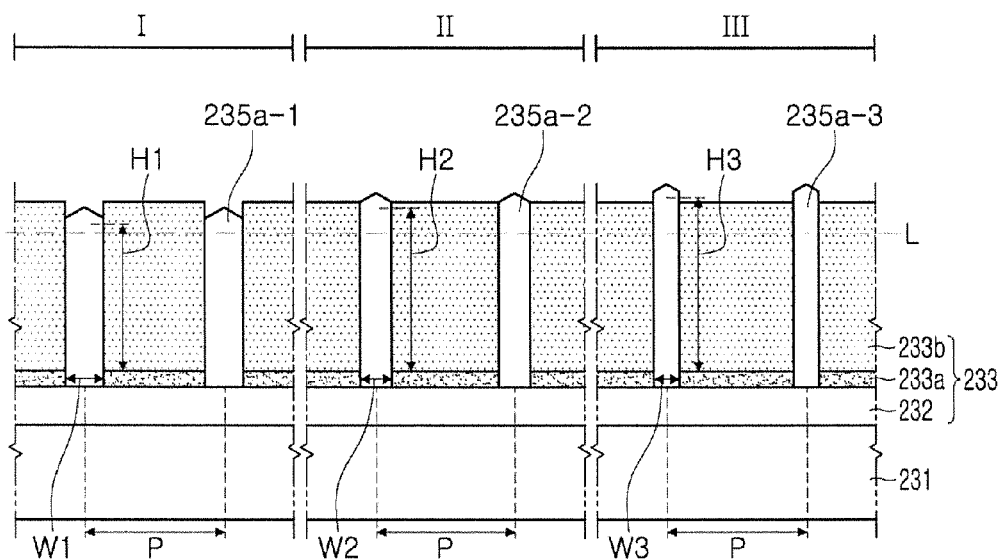

Next, as illustrated in FIG. 16B, a plurality of nanocores 235a-1, 235a-2, and 235a-3 may be formed by growing a first conductivity-type semiconductor on the exposed the base layer 232 to fill the openings O1, O2, and O3 on the first to third regions I, II, and III.

The first conductivity-type semiconductor of the nanocores 235a-1, 235a-2, and 235a-3 may be an n-type nitride semiconductor, and the same material as the first conductivity-type semiconductor of the base layer 232. For example, the base layer 232 and the nanocores 235a-1, 235a-2, and 235a-3 may be formed of n-type GaN.

Single crystal nitride forming the nanocores 235a-1, 235a-2, and 235a-3 may be formed by an MOCVD or MBE process, and the single crystal nitride filling the openings O1, O2, and O3 may be grown to have a shape and size corresponding to the shape and size of the openings O1, O2, and O3. That is, a diameter of the nanocores 235a-1 in the first region may be greater than a diameter of the nanocores 235a-2 in the second region, and the diameter of the nanocores 235a-2 in the second region may be greater than a diameter of the nanocores 235a-3 in the third region. On the contrary, the height of the nanocores maybe inversely proportional to the diameter, since the same growth process is applied. That is, a height of the nanocores 235a-1 in the first region may be lower than a height of the nanocores 235a-2 in the second region, and the height of the nanocores 235a-2 in the second region maybe lower than the height of the nanocores 235a-3 in the third region (H1<H2<H3). In the subsequent process, a quantum well thickness may be increased, according to the diameter of the nanocores. However, such a change of the quantum well thickness may be offset by the height, which is inversely proportional to the diameter (please refer to formula (1)).

Figure 16C:
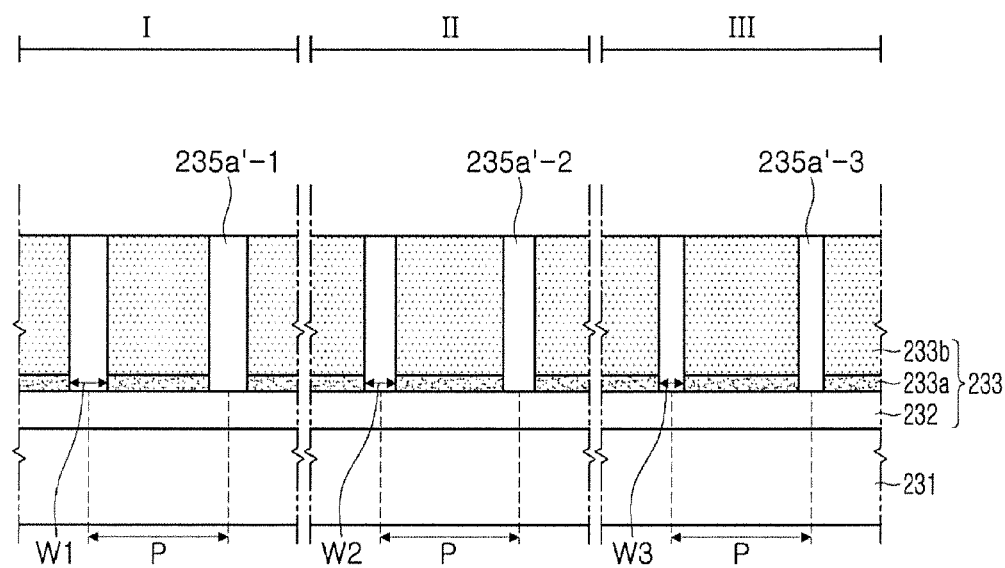

In order to eliminate such variations in height, a process of planarizing the nanocores 235a-1, 235a-2, and 235a-3 to a uniform level L may be introduced as illustrated in FIG. 16C.

In this planarization process, the mask maybe used as a structure supporting the nanocores 235a-1, 235a-2, and 235a-3. Accordingly, the planarization process may be easily performed with no damage on the nanocores 235a-1, 235a-2, and 235a-3. The planarization process may be performed after forming a core-shell structure or a contact electrode. In this case, the planarization process may be omitted in this process step.

Figure 16D:
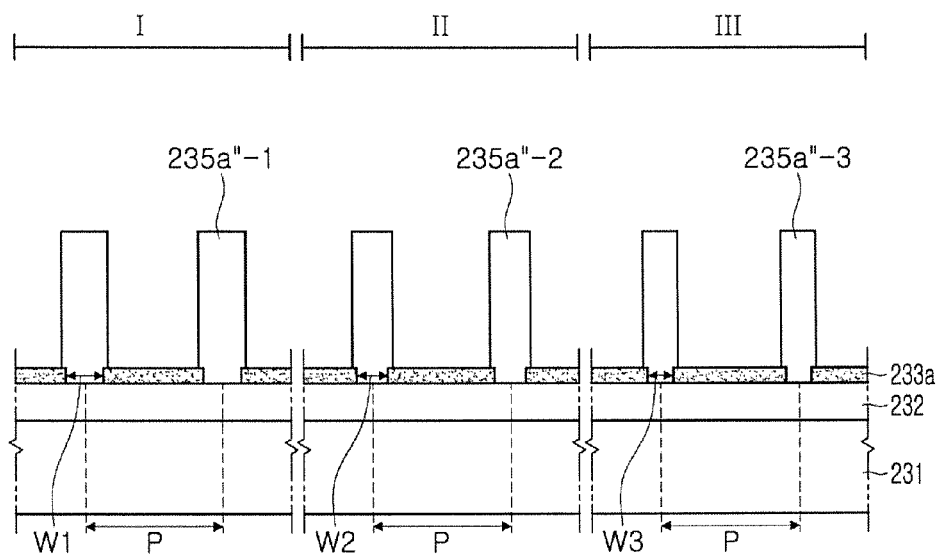

Next, as illustrated in FIG. 16D, the mask 233 may be selectively removed to the first material layer 233, that is, the etch stop layer, to expose side surfaces of the plurality of nanocores 235a-1, 235a-2, and 235a-3, and then a heat treatment or a regrowth process may be performed.

When the heat treatment or the regrowth process is finished, nanocores 235a'-1, 235a'-2, and 235a'-3 having final diameters $D_1$, $D_2$, and $D_3$ satisfying formulas (c), and (e-1) to (e-3) may be formed. In this manner, by securing the different diameters of nanocores according to the regions I, II, and III, the active layers to be formed in the subsequent process may emit light having different wavelengths and combined to be white light.

Figure 16E:
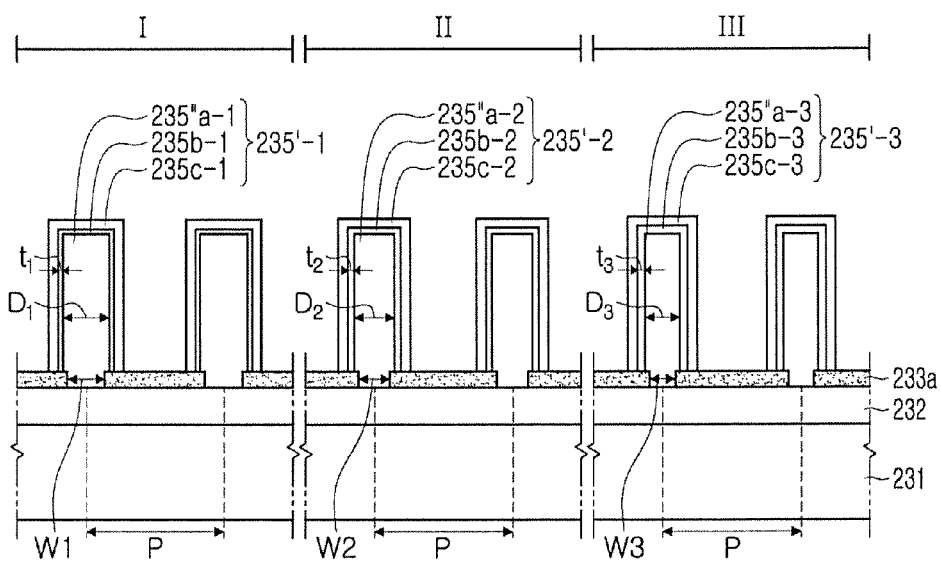

Next, as illustrated in FIG. 16E, active layers 235b-1, 235b-2, and 235b-3 and second conductivity-type semiconductor layers 235c-1, 235c-2, 235c-3 are sequentially formed on surfaces of the plurality of nanocores 235a'-1, 235a'-2, and 235a'-3.

The process may be performed on the nanocores 235a'-1, 235a'-2, and 235a'-3 respectively disposed in the regions I, II, and III in the same conditions, similar to the growth process and the heat treatment/regrowth process of the nanocores. That is, the process may be performed in the same chamber by supplying the same source at the same flow rate under the same temperature and pressure conditions. Regardless of the same process conditions, the diameters of the nanocores 235a'-1, 235a'-2, and 235a'-3 are different by region, layers grown on the surfaces of the nanocores 235a'-1, 235a'-2, and 235a'-3, especially the active layers 235b-1, 235b-2, and 235b-3, may have different thicknesses ($t_1 < t_2 < t_3$) in respective regions I, II, and III. In addition, since the quantum well thicknesses are different by region, the compositions of the quantum wells (e.g. indium composition) may be different. As a result, the active layers 235b-1, 235b-2, and 235b-3 grown on the respective regions I, II, and III may emit light having different wavelengths.

For example, thin quantum wells may be formed in the active layers 235b-1 grown on the nanocores 235a'-1 having the greatest first diameter $D_1$ in the first region and emit short wavelength light such as blue light, and thick quantum wells may be formed in the active layers 235b-3 grown on the nanocores 235a'-3 having the smallest third diameter $D_3$ in the third region and emit a long wavelength light such as red light. In addition, the active layers 235b-2 grown on the nanocores 235a'-2 having an intermediate second diameter $D_2$ in the second region may emit an intermediate wavelength light such as green light. As a result, the nanostructure semiconductor light-emitting device may emit white light by combining light emitted from regions I, II, and III.

Experiment 3: Semiconductor Light-Emitting Device According to Pitch of Nanocores In this Experiment, a $SiO_2$ mask was formed on an n-GaN base layer. Here, the mask was divided into three regions. In addition, three samples including openings having the same width and different pitches $P_1$, $P_2$, and $P_3$ by regions were prepared. The ratios of pitches $P_1$, $P_2$, and $P_3$ were different as listed in the following Table 4.

Next, n-GaN nanocores were grown on each Sample under the same MOCVD process conditions. Nanocores substantially having the same size, although slightly different depending on a re-growth process, were formed by group corresponding to the region of the mask. Next, InGaN/GaN active layers and p-AlGaN/p-GaN layers were sequentially grown on surfaces of the nanocores. Under the same process conditions, the thicknesses $T_1$, $T_2$, and $T_3$ of quantum wells QW grown on the nanocores substantially having the same size are different by group, and the ratios of the thicknesses $T_1$, $T_2$, and $T_3$ are as listed in Table 4. In addition, since the quantum wells have different thicknesses and different indium contents, wavelengths of light emitted by the active layers are different by group as listed in Table 5.

TABLE 5

| Items | Pitch Ratio ($P_1:P_2:P_3$) | QW thickness Ratio ($T_1:T_2:T_3$) | Emission Wavelength Peak By Group | | |
|---|---|---|---|---|---|
| | ($P_1$, $P_2$, $P_3$) | $T_1:T_2:T_3$ | Group 1 | Group 2 | Group 3 |
| Sample 1 | 1:1.3:1.8 | 1:1.5:2 | 471 | 515 | 564 |
| Sample 2 | 1:1.64:2.36 | 1:1.5:2.25 | 463 | 499 | 547 |
| Sample 3 | 1:1.2:1.6 | 1:1.75:2.67 | 480 | 530 | 590 |

As listed in the above Table 5, all of the semiconductor light-emitting devices of the first to third Samples emit light having different wavelengths by group, and white light may be provided by combining the light having the different wavelengths.

As the pitch conditions provided in this Experiment, in order to obtain white light, pitches of the nanocores of the second and third groups may be designed to be at least 20% greater than pitches of the first and second groups, respectively, so as to secure the differences in wavelengths of light emitted by each group.

In this manner, the wavelength of light emitted by the active layers may be controlled by group using the composition of indium and the thickness of the quantum well. The indium content may be controlled by controlling a flow rate of indium source and a growth temperature in the MOCVD process, but it is difficult to control the flow rate and the growth temperature independently by group. Accordingly, as described above, under the same process conditions (e.g. the indium flow rate and the growth temperature), the wavelength may be controlled by controlling the quantum well thickness by group. More specifically, parameters related to the nanocores, such as pitch, diameter, and height, may be varied in order to form active layers emitting light having different wavelengths by region, that is, by group. In this process, although the active layers are formed under the same process conditions, the thickness of the quantum wells may differ by group, and thus indium content in the quantum wells may differ by group.

Figure 17:
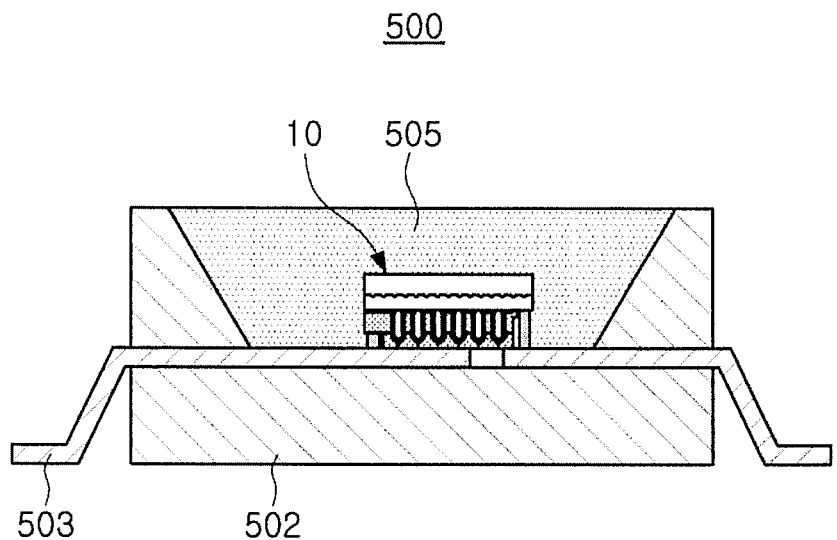
FIGS. 17 and 18 are cross-sectional views illustrating nanostructure semiconductor light-emitting device packages according to exemplary embodiments.
Figure 18:
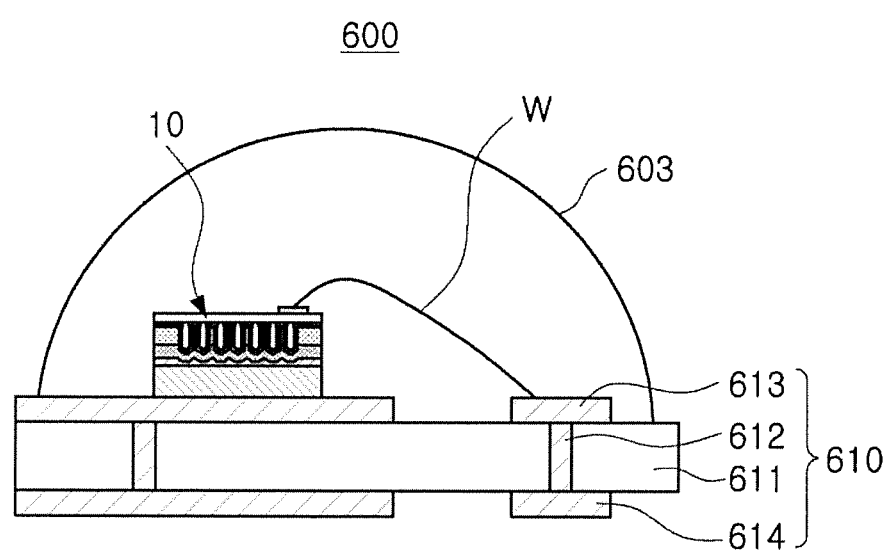

The nanostructure semiconductor light-emitting device according to the exemplary embodiments of the present disclosure may be implemented in various kinds of applications. FIGS. 17 and 18 illustrate examples of a package including the above-described semiconductor light-emitting device.

A semiconductor light-emitting device package 500 illustrated in FIG. 17 may include a nanostructure semiconductor light-emitting device 10, a package body 502, and a pair of lead frames 503.

The nanostructure semiconductor light-emitting device 10 may be mounted on the lead frames 503, and electrodes thereof may be electrically connected to the lead frames 503. As needed, the nanostructure semiconductor light-emitting device 10 may be mounted on a region other than the lead frames 503. For example, the nanostructure semiconductor light-emitting device 10 may be mounted on the package body 502. In addition, the package body 502 may have a cup shape in order to improve reflection efficiency of light. In this reflection cup, an encapsulant 505 may be formed of a transparent material to encapsulate the nanostructure semiconductor light-emitting device 10 and wires W.

A semiconductor light-emitting device package 600 illustrated in FIG. 18 may include the nanostructure semiconductor light-emitting device 10 illustrated in FIG. 1, a mounting board 610, and an encapsulant 603.

The nanostructure semiconductor light-emitting device 10 may be mounted on the mounting board 610 and electrically connected to the mounting board 610 through a wire W.

The mounting board 610 may include a board body 611, an upper electrode 613, a lower electrode 614, and a through-electrode 612 connecting the upper electrode 613 to the lower electrode 614. The mounting board 610 may be a PCB, a MCPCB, a MPCB, a FPCB, or the like, and the structure of the mounting board 610 may be applied in various forms.

The encapsulant 603 may have a dome-shaped lens structure having a convex upper surface. In some embodiments, the encapsulant 603 may have a convex or concave lens structure to adjust an orientation angle of light emitted through the upper surface of the encapsulant 603. As needed, a wavelength-conversion material, such as a fluorescent material or a quantum point, may be disposed on the surface of the encapsulant 603 or the nanostructure semiconductor light-emitting device 10.

The nanostructure semiconductor light-emitting device according to the above-described exemplary embodiments of the present disclosure may be adopted as a light source of various applications. FIGS. 19 to 22 illustrate various applications including a nanostructure semiconductor light-emitting device according to the exemplary embodiments of the present disclosure.

Figure 19:
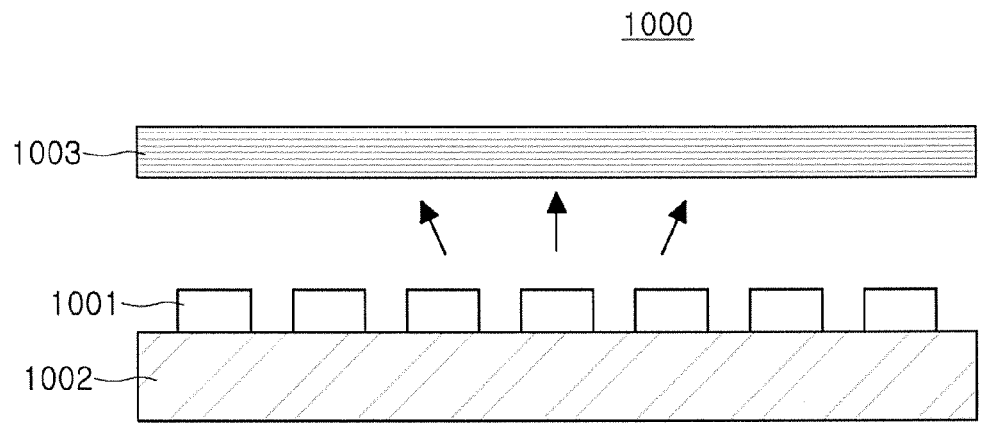
FIGS. 19 and 20 illustrate examples of an illumination apparatus including a nanostructure semiconductor light-emitting device according to an exemplary embodiment.
Figure 20:
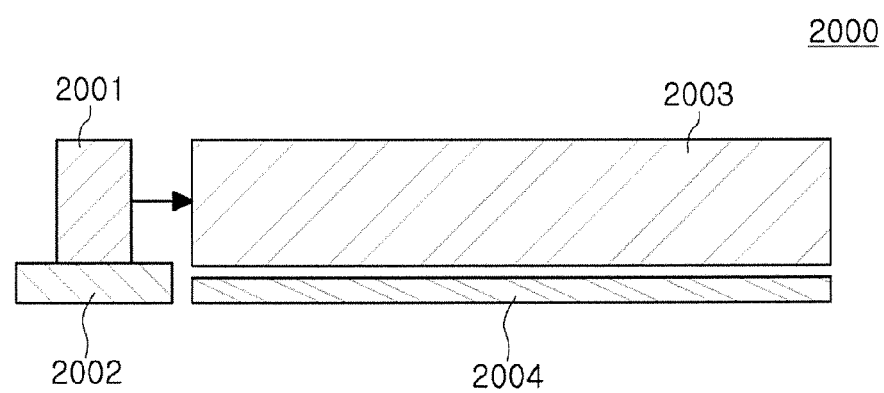

FIGS. 19 and 20 illustrate examples in which a nanostructure semiconductor light-emitting device according to an exemplary embodiment of the present disclosure is applied to a backlight unit.

Referring to FIG. 19, a backlight unit 1000 may include a light source 1001 mounted on a substrate 1002, and one or more optical sheets 1003 disposed on the light source 1001. The light source 1001 may include the above-described nanostructure semiconductor light-emitting device or a package including the nanostructure semiconductor light-emitting device.

The light source 1001 in the backlight unit 1000 illustrated in FIG. 19 emits light toward a top surface where a liquid crystal display (LCD) is disposed. On the contrary, in another backlight unit 2000 illustrated in FIG. 20, a light source 2001 mounted on a substrate 2002 emits light in a lateral direction, and the emitted light may be incident to a light guide plate 2003 and converted to the form of surface light. Light passing through the light guide plate 2003 is emitted upwardly, and a reflective layer 2004 may be disposed on a bottom surface of the light guide plate 2003 to improve light extraction efficiency.

Figure 21:
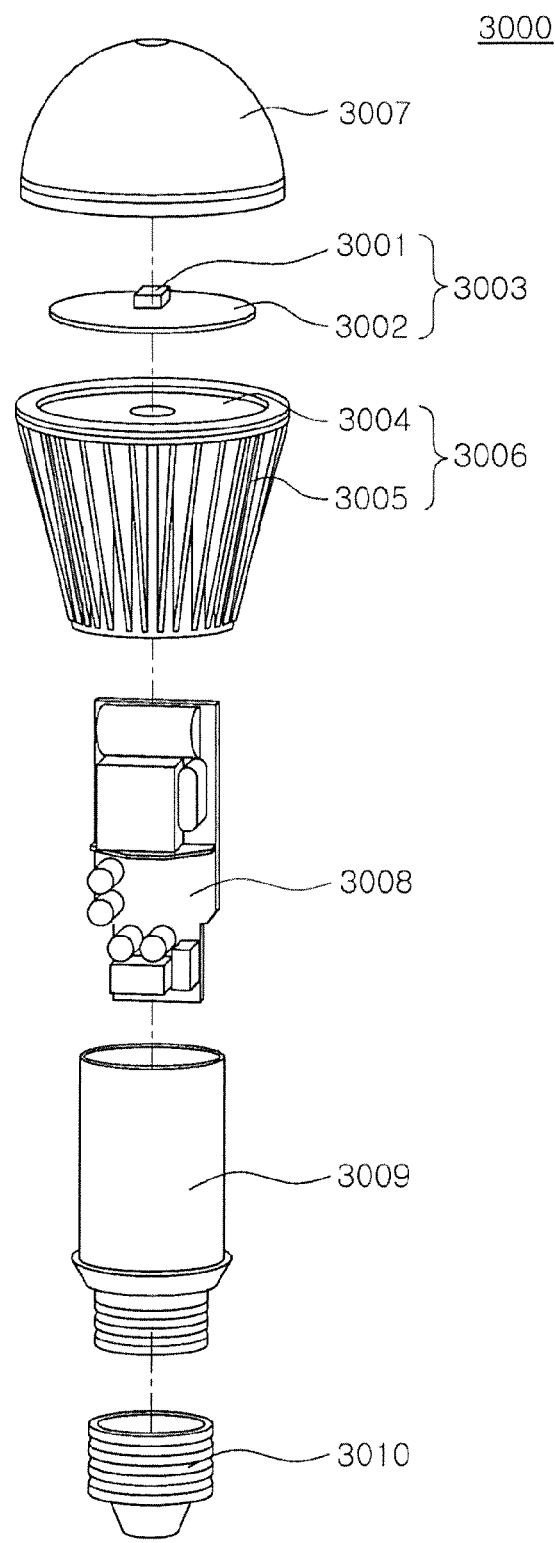
FIG. 21 illustrates an example of an illumination apparatus including a nanostructure semiconductor light-emitting device according to an exemplary embodiment.

FIG. 21 is an exploded perspective view illustrating an illumination apparatus including a nanostructure semiconductor light-emitting device according to an exemplary embodiment of the present disclosure.

The illumination apparatus 3000 of FIG. 21 is illustrated as a bulb-type lamp as an example, and includes a light-emitting module 3003, a driving unit 3008, and an external connection portion 3010.

In addition, external structures, such as external and internal housings 3006 and 3009 and a cover 3007, may be further included. The light-emitting module 3003 may include a light source 3001, that is, the above-described nanostructure semiconductor light-emitting device or a package including the nanostructure semiconductor light-emitting device, and a circuit board 3002 with the light source 3001 mounted thereon. For example, first and second electrodes of the nanostructure semiconductor light-emitting device may be electrically connected to an electrode pattern of the circuit board 3002. In this exemplary embodiment, a single light source 3001 is mounted on the circuit board 3002, but a plurality of light sources 3001 may be mounted as needed.

The external housing 3006 may function as a heat dissipation unit, and include a heat dissipation plate 3004 in direct contact with the light-emitting module 3003 to enhance a heat dissipation effect, and a heat radiation fin 3005 surrounding a side surface of the illumination apparatus 3000. The cover 3007 may be installed on the light-emitting module 3003, and have a convex lens shape. The driving unit 3008 may be installed in the internal housing 3009 and connected to the external connection portion 3010, such as a socket structure, to receive power from an external power source.

In addition, the driving unit 3008 may function to convert the power to an appropriate current source capable of driving the light source 3001 of the light-emitting module 3003. For example, the driving unit 3008 maybe configured as an AC-DC converter, a rectifying circuit component, or the like.

Figure 22:
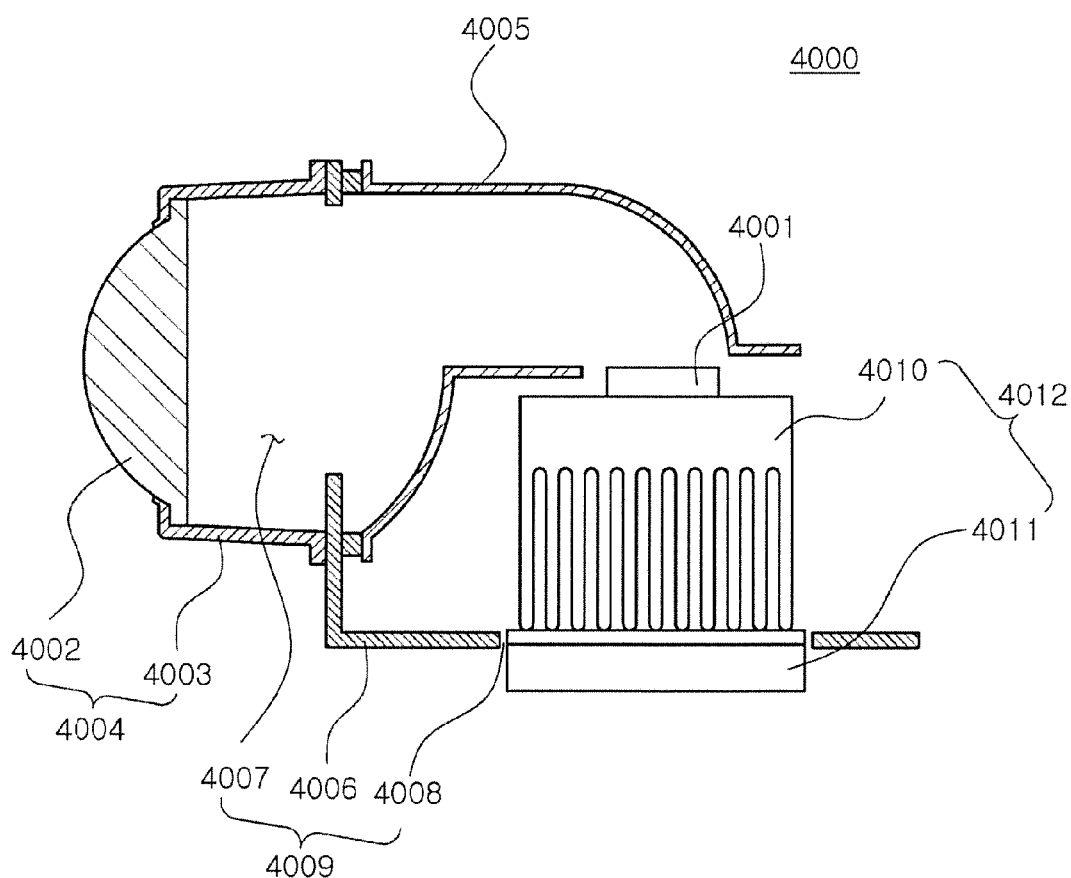
FIG. 22 illustrates an example of a headlamp including a nanostructure semiconductor light-emitting device according to an exemplary embodiment.

FIG. 22 illustrates an example in which a nanostructure semiconductor light-emitting device according to an exemplary embodiment of the present disclosure is applied to a headlamp.

Referring to FIG. 22, a headlamp 4000 used as a vehicle lamp, or the like, may include a light source 4001, a reflective unit 4005, and a lens cover unit 4004. The lens cover unit 4004 may include a hollow-type guide 4003 and a lens 4002. The light source 4001 may include the above-described nanostructure semiconductor light-emitting device or a package including the nanostructure semiconductor light-emitting device.

The headlamp 4000 may further include a heat dissipation unit 4012 dissipating heat generated by the light source 4001 outwardly. In order to effectively dissipate heat, the heat dissipation unit 4012 may include a heat sink 4010 and a cooling fan 4011. In addition, the headlamp 4000 may further include a housing 4009 fixedly supporting the heat dissipation unit 4012 and the reflective unit 4005. The housing 4009 may have a central opening 4008 formed in one surface thereof, in which the heat dissipation unit 4012 is coupledly installed.

The housing 4009 may include a front opening 4007 formed on the other surface integrally connected to the one surface and bent in a right angle direction. The front opening 4007 may fix the reflective unit 4005 to be disposed over the light source 4001. Accordingly, a front side of the housing 4009 may be open by the reflective unit 4005. The reflective unit 4005 is fixed to the housing 4009 such that the opened front side corresponds to the front opening 4007, and thereby light reflected by the reflective unit 4005 may pass through the front opening 4007 to be emitted outwardly.

As set forth above, according to the exemplary embodiments of the present disclosure, a nanostructure semiconductor light-emitting device may emit light having different wavelengths by using light-emitting nanostructures grown on the same substrate in the same MOCVD process condition. By controlling at least one of the size (a diameter and/or a height) and the pitch of nanocores, a plurality of groups of light-emitting nanostructures may emit light having different emission wavelengths by group. In addition, a semiconductor light-emitting device emitting white light as final light by combining different emission wavelengths.

While exemplary embodiments have been shown and described above, it will be apparent to those skilled in the art that modifications and variations could be made without departing from the scope of the present disclosure as defined by the appended claims.

What is claimed is:

1. A nanostructure semiconductor light-emitting device, comprising:
    a base layer formed of a first conductivity-type semiconductor;
    an insulating layer disposed on the base layer and having a plurality of openings exposing portions of the base layer; and
    a plurality of light-emitting nanostructures disposed in the plurality of openings, respectively, each of the light-emitting nanostructures including a nanocore formed of a first conductivity-type semiconductor, an active layer, and a second conductivity-type semiconductor layer sequentially disposed on a surface of the nanocore,
    wherein the plurality of light-emitting nanostructures are formed through the same growth process and divided into n groups (where n is an integer of two or more), each group having at least two light-emitting nanostructures, and
    wherein the active layer of each light-emitting nanostructure in each group has a quantum well structure, the quantum well thickness $T_i$ of the active layers of each group satisfy the following formulas (1) and (2):

$$T_i = K \frac{P_i^2}{(D_i \times H_i)} \quad 1 <= i <= n \tag{1}$$

$$T_1 < T_2 < \ldots < T_{n-1} < T_n, \tag{2}$$

wherein K is a proportional constant, $D_i$ and $H_i$ respectively are a diameter and a height of the nanocores of the i$^{th}$ group, and P$_i$ is a pitch of the nanocores of the i$^{th}$ group, and at least one of D$_i$, H$_i$, and P$_i$ is different so that the active layers emit light having different wavelengths by group.

2. The nanostructure semiconductor light-emitting device of claim 1, wherein the n groups include first to third groups, and light emitted by the active layers of the first to third groups is combined to provide white light.

3. The nanostructure semiconductor light-emitting device of claim 2, wherein an emission wavelength of the active layers of the first group is in the range of about 430 nm to about 480 nm, an emission wavelength of the active layers of the second group is in the range of about 480 nm to about 540 nm, and an emission wavelength of the active layers of the third group is in the range of about 540 nm to about 605 nm.

4. The nanostructure semiconductor light-emitting device of claim 3, wherein a quantum well thickness of the active layers of the first group is in the range of about 1 nm to about 5 nm, a quantum well thickness of the active layers of the second group is in the range of about 1.5 nm to about 5.5 nm, and a quantum well thickness of the active layers of the third group is in the range of about 2 nm to about 7.5 nm.

5. The nanostructure semiconductor light-emitting device of claim 4, wherein the nanocores of each group have substantially the same size, and
the quantum well thicknesses of the active layers of the second and the third groups are at least 40% greater than the quantum well thicknesses of the active layers of the first and the second groups, respectively.

6. The nanostructure semiconductor light-emitting device of claim 5, wherein the quantum well thickness of the active layers of the first group is about 1.5 nm or more.

7. The nanostructure semiconductor light-emitting device of claim 4, wherein quantum wells of the active layers of the first to third groups include nitride layers containing indium (In), and the quantum wells of the active layers of at least some of the groups have a different In content.

8. The nanostructure semiconductor light-emitting device of claim 2, wherein a relative ratio (P$_1$:P$_2$:P$_3$) of pitches of the nanocores of the first to third groups satisfy the following formulas (a), and (b-1) to (b-3):

$$P_1 < P_2 < P_3 \quad (a)$$

$$1 < P_1 < 2.24 \quad (b-1)$$

$$1.2 < P_2 < 2.35 \quad (b-2)$$

$$1.4 < P_3 < 2.74 \quad (b-3).$$

9. The nanostructure semiconductor light-emitting device of claim 8, wherein the nanocores of each group have substantially the same size, and
the pitches of the nanocores of the second and third groups are at least 20% greater than the pitches of the nanocores of the first and second groups, respectively.

10. The nanostructure semiconductor light-emitting device of claim 9, wherein the pitches of the nanocores of the first group is in the range of about 0.5 μm to about 2.5 μm.

11. The nanostructure semiconductor light-emitting device of claim 9, wherein the nanocores of at least one of the first to third groups have a different size from the nanocores of another group of the first to third groups.

12. The nanostructure semiconductor light-emitting device of claim 2, wherein a relative ratio of the product of a diameter D, and a height H, of the nanocores satisfy at least one of the following formulas (c) and (d), and satisfy formulas (e-1) to (e-3):

$$D_1 > D_2 > D_3 \quad (c)$$

$$H_1 > H_2 > H_3 \quad (d)$$

$$0.2 < D_1 \times H_1 < 1 \quad (e-1)$$

$$0.18 < D_2 \times H_2 < 0.67 \quad (e-2)$$

$$0.13 < D_3 \times H_3 < 0.5 \quad (e-3).$$

13. The nanostructure semiconductor light-emitting device of claim 12, wherein the nanocores of each group have substantially the same pitch, and
the diameters of the nanocores of the second and third groups are about at least 40% smaller than the diameters of the nanocores of the first and second groups, respectively.

14. The nanostructure semiconductor light-emitting device of claim 12, wherein the nanocores of each group have substantially the same pitch, and
the heights of the nanocores of the second and third groups are about at least 40% smaller than the heights of the nanocores of the first and second groups, respectively.

15. The nanostructure semiconductor light-emitting device of claim 12, wherein the nanocores of at least one group among the first to third groups are arranged to have a different pitch from the nanocores of another group of the first to third groups.

16. The nanostructure semiconductor light-emitting device of claim 12, wherein the nanocores of each group have the same height and different diameters.

17. The nanostructure semiconductor light-emitting device of claim 12, wherein the pitches of the nanocores of at least the third group is greater than 1.5 μm.

18. The nanostructure semiconductor light-emitting device of claim 12, wherein an upper surface of the base layer is divided into first to third regions, and
the light-emitting nanostructures of the first to third groups are arranged in the first to third regions, respectively.

19. The nanostructure semiconductor light-emitting device of claim 18, wherein at least one of the first to third regions have a different size from another region of the first to third regions.

20. A nanostructure semiconductor light-emitting device, comprising:
a base layer formed of a first conductivity-type semiconductor;
an insulating layer disposed on the base layer and having a plurality of openings exposing portions of the base layer; and
a plurality of light-emitting nanostructures disposed in the plurality of openings, respectively, each of the light-emitting nanostructures including a nanocore formed of a first conductivity-type semiconductor, an active layer, and a second conductivity-type semiconductor layer sequentially disposed on a surface of the nanocore,
wherein the plurality of light-emitting nanostructures are formed through the same growth process, and divided into first to third groups, each group having at least two light-emitting nanostructures, and
wherein the active layer of each light-emitting nanostructure in each group has a quantum well structure, the quantum wells of the active layers emit a light having different wavelengths by group, and satisfy the following formula (1):

$$T_1 < T_2 < T_3 \qquad (1),$$

and a relative ratio ($P_1:P_2:P_3$) of pitches of the nanocores satisfy the following formulas:

$$P_1 < P_2 < P_3 \qquad (a)$$

$$1 < P_1 < 2.24 \qquad (b\text{-}1)$$

$$1.2 < P_2 < 2.35 \qquad (b\text{-}2)$$

$$1.4 < P_3 < 2.74 \qquad (b\text{-}3).$$

* * * * *